(12) United States Patent
Hamada

(10) Patent No.: US 7,690,853 B2
(45) Date of Patent: *Apr. 6, 2010

(54) SUBSTRATE PROCESSING APPARATUS

(75) Inventor: Tetsuya Hamada, Kyoto (JP)

(73) Assignee: Sokudo Co., Ltd., Kyoto (JP)

( * ) Notice: Subject to any disclaimer, the term of this patent is extended or adjusted under 35 U.S.C. 154(b) by 440 days.

This patent is subject to a terminal disclaimer.

(21) Appl. No.: 11/623,231

(22) Filed: Jan. 15, 2007

(65) Prior Publication Data

US 2007/0172233 A1   Jul. 26, 2007

(30) Foreign Application Priority Data

Jan. 25, 2006 (JP) ............... 2006-016464

(51) Int. Cl.
*G03D 5/00* (2006.01)
*G03B 27/32* (2006.01)
*B08B 3/00* (2006.01)

(52) U.S. Cl. ............... 396/611; 355/27; 134/61

(58) Field of Classification Search ........... 396/611; 355/27; 414/935; 118/52; 134/61
See application file for complete search history.

(56) References Cited

U.S. PATENT DOCUMENTS

| | | | |
|---|---|---|---|
| 6,893,171 | B2 | 5/2005 | Fukutomi et al. |
| 7,284,917 | B2* | 10/2007 | Ishida et al. ............ 396/611 |
| 7,497,633 | B2* | 3/2009 | Kaneyama et al. ......... 396/611 |
| 2006/0098979 | A1* | 5/2006 | Kaneyama et al. ......... 396/611 |
| 2006/0177586 | A1 | 8/2006 | Ishida et al. |
| 2007/0166031 | A1* | 7/2007 | Hamada ................ 396/611 |
| 2007/0177869 | A1* | 8/2007 | Yamamoto et al. ........ 396/611 |

FOREIGN PATENT DOCUMENTS

| | | |
|---|---|---|
| JP | 2003-324139 | 11/2003 |
| JP | 2005-294520 | 10/2005 |
| JP | 2006-222158 | 8/2006 |
| WO | WO 99/49504 | 9/1999 |

OTHER PUBLICATIONS

U.S. Appl. No. 10/926,718.
U.S. Appl. No. 11/273,463.
U.S. Appl. No. 11/273,440.
U.S. Appl. No. 11/273,465.
U.S. Appl. No. 11/273,441.
U.S. Appl. No. 11/273,439.
U.S. Appl. No. 11/294,877.
U.S. Appl. No. 11/295,257.
U.S. Appl. No. 11/294,727.

(Continued)

*Primary Examiner*—Alan A Mathews
(74) *Attorney, Agent, or Firm*—Townsend and Townsend and Crew LLP

(57) ABSTRACT

A substrate processing apparatus comprises an indexer block, an anti-reflection film processing block, a resist film processing block, a development processing block, a resist cover film processing block, a resist cover film removal block, and an interface block. An exposure device is arranged adjacent to the interface block. The interface block includes a substrate replacement group. The substrate replacement group has a stack of three cleaning/drying processing units. The cleaning/drying processing unit subjects the substrate after exposure processing to cleaning and drying processing.

6 Claims, 14 Drawing Sheets

OTHER PUBLICATIONS

U.S. Appl. No. 11/295,240.
U.S. Appl. No. 11/295,216.
U.S. Appl. No. 11/472,780.
U.S. Appl. No. 11/474,614.
U.S. Appl. No. 11/475,598.
U.S. Appl. No. 11/534,293.
U.S. Appl. No. 11/621,216.

* cited by examiner

F I G. 7
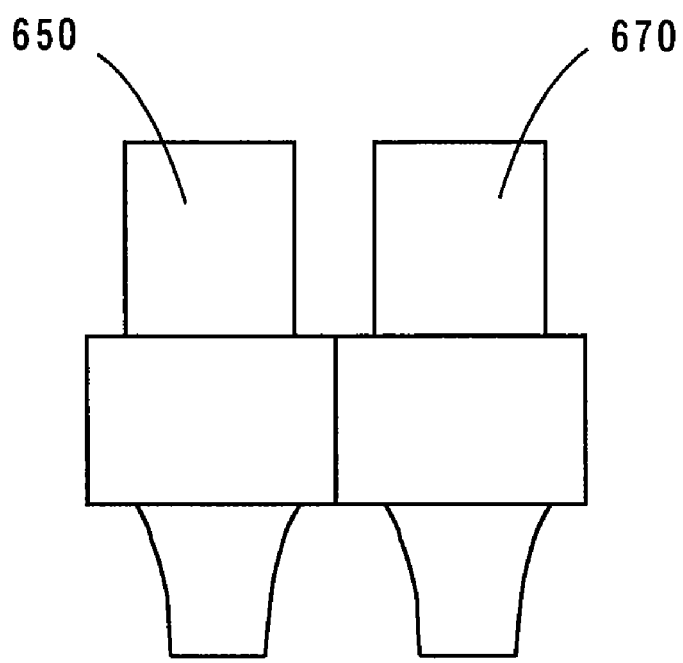

F I G. 1 0
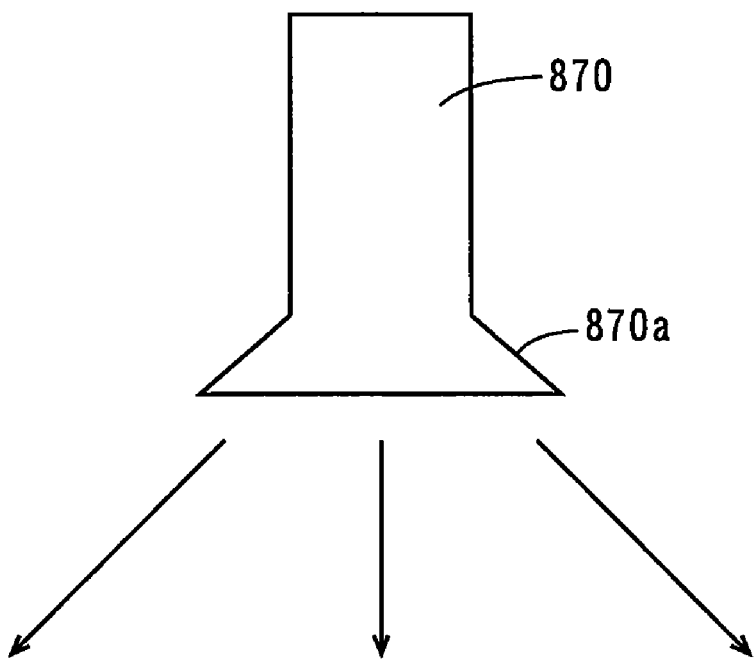

SUBSTRATE PROCESSING APPARATUS

BACKGROUND OF THE INVENTION

1. Field of the Invention

The present invention relates to a substrate processing apparatus for subjecting substrates to processing.

2. Description of the Background Art

Substrate processing apparatuses are used to subject various types of substrates such as semiconductor substrates, substrates for liquid crystal displays, plasma displays, optical disks, magnetic disks, magneto-optical disks, and photomasks, and other substrates to various types of processing.

Such a substrate processing apparatus generally subjects a single substrate to a plurality of different types of processing successively. The substrate processing apparatus as described in JP 2003-324139 A comprises an indexer block, an anti-reflection film processing block, a resist film processing block, a development processing block, and an interface block. An exposure device is arranged adjacent to the interface block as an external device separate from the substrate processing apparatus.

In the above-mentioned substrate processing apparatus, a substrate carried out of the indexer block is transported to the exposure device through the interface block after being subjected to anti-reflection film formation and resist film coating processing in the anti-reflection film processing block and the resist film processing block. After the resist film on the substrate is subjected to exposure processing in the exposure device, the substrate is transported to the development processing block through the interface block. After the resist film on the substrate is subjected to development processing to form a resist pattern thereon in the development processing block, the substrate is transported to the indexer block.

With recent increases in density and integration of devices, making finer resist patterns has become an important problem. Conventional exposure devices have generally performed exposure processing by reduction-projecting a reticle pattern on a substrate through a projection lens. With such conventional exposure devices, however, the line width of an exposure pattern is determined by the wavelength of a light source of the exposure device. Therefore, making finer resist patterns has had a limitation.

Therefore, a liquid immersion method is suggested as a projection exposure method allowing for finer exposure patterns (see, e.g., WO99/49504 pamphlet). In the projection exposure device according to the WO99/49504 pamphlet, an area between a projection optical system and a substrate is filled with a liquid, resulting in a shorter wavelength of exposure light on a main surface of the substrate. This allows for finer exposure patterns.

However, in the projection exposure device according to the above-mentioned WO99/49504 pamphlet, exposure processing is performed with the substrate and the liquid being in contact with each other. Accordingly, the substrate to which the liquid adheres is carried out of the exposure device. When the exposure device using the liquid immersion method as described in the above-mentioned WO99/49504 pamphlet is provided as an external device in the substrate processing apparatus according to the above-mentioned JP 2003-324139 A, therefore, the liquid adhering to the substrate that has been carried out of the exposure device may drop in the substrate processing apparatus, causing operational troubles such as abnormalities in an electric system of the substrate processing apparatus.

When the liquid adheres to the substrate that has been subjected to the exposure processing, particles and the like may adhere to the substrate. When the particles and the like adhere to the substrate, processing defects may occur in the substrate.

SUMMARY OF THE INVENTION

An object of the invention is to provide a substrate processing apparatus in which operational troubles and processing defects due to a liquid that has adhered to a substrate in an exposure device are prevented.

(1) A substrate processing apparatus according to an aspect of the present invention is a substrate processing apparatus that is arranged adjacent to an exposure device, including a processing section for subjecting a substrate to processing, and an interface that transfers and receives the substrate between the processing section and the exposure device, the interface including a drying processing unit that subjects the substrate to drying processing after exposure processing by the exposure device, a platform on which the substrate is temporarily placed, a first transport unit that transports the substrate among the processing section, the platform, and the drying processing unit, and a second transport unit that transports the substrate among the platform, the exposure device, and the drying processing unit, the second transport unit carrying the substrate after the exposure processing by the exposure device into the drying processing unit, the first transport unit carrying the substrate after the drying processing by the drying processing unit out of the drying processing unit.

In the substrate processing apparatus, the substrate is subjected to predetermined processing in the processing section, and the substrate is then transported to the platform by the first transport unit in the interface. The substrate is then transported from the platform to the exposure device by the second transport unit. The substrate is subjected to the exposure processing in the exposure device, and is then transported to the drying processing unit by the second transport unit. In the drying processing unit, the substrate is subjected to the drying processing, and is then transported to the processing section by the first transport unit.

In such a way, the substrate after the exposure processing is transported to the processing section after being dried in the drying processing unit. In this case, even if a liquid adheres to the substrate in the exposure device, the liquid can be prevented from dropping in the substrate processing apparatus. As a result, operational troubles of the substrate processing apparatus can be prevented.

The substrate is subjected to the drying processing, thereby preventing particles and the like in an atmosphere from adhering to the liquid that has adhered to the substrate during the exposure processing. This can prevent processing defects in the substrate.

Furthermore, the first transport unit transports the substrate after the drying processing by the drying processing unit to the processing section. Therefore, even if the liquid adheres to the substrate during the exposure processing, the liquid is prevented from adhering to the first transport unit. Consequently, the liquid does not adhere to the substrate before the exposure processing, thereby preventing the particles and the like in the atmosphere from adhering to the substrate before the exposure processing. This can prevent contamination in the exposure device and can sufficiently prevent processing defects in the substrate.

In the interface, the drying processing unit serves as the platform on which the substrate is to be placed in receiving and transferring the substrate between the second transport unit and the first transport unit. Consequently, the necessity of separately providing the platform for receiving and transferring the substrate from the second transport unit to the first transport unit is eliminated, thereby allowing the configuration of the interface to be simplified. This allows the manufacturing cost of the substrate processing apparatus to be reduced. Further, a transport path of the substrate within the interface can be simplified, thereby allowing throughput to be improved. Further, the number of access points for transportation of the substrate can be reduced, thereby simplifying the operation of the second transport unit.

(2) The drying processing unit may subject the substrate to cleaning processing before subjecting the substrate to the drying processing. In this case, even if the particles and the like in the atmosphere adhere to the substrate when the substrate to which the liquid has adhered during the exposure processing is transported from the exposure device to the drying processing unit, the attachment can be reliably removed. This can reliably prevent the processing defects in the substrate.

(3) The interface may further include a cleaning processing unit that subjects the substrate to cleaning processing before the exposure processing by the exposure device, and the first transport unit may transport the substrate among the processing section, the cleaning processing unit, and the drying processing unit.

In this case, the substrate is subjected to predetermined processing in the processing section, and is then transported to the cleaning processing unit by the first transport unit in the interface. The substrate is subjected to the cleaning processing in the cleaning processing unit, and is then transported to the platform by the first transport unit. Thereafter, the substrate is transported from the platform to the exposure device by the second transport unit.

In such a way, in the substrate processing apparatus, the cleaning processing unit subjects the substrate to the cleaning processing before the exposure processing. This makes it possible to remove particles and the like that have adhered to the substrate in the processing step before the exposure processing immediately before the exposure processing. As a result, it is possible to prevent contamination in the exposure device and to reliably prevent processing defects in the substrate.

(4) The cleaning processing unit may subject the substrate to the drying processing after subjecting the substrate to the cleaning processing. In this case, the particles and the like in the atmosphere can be prevented from adhering to the substrate after the cleaning processing. This can reliably prevent the contamination in the exposure device. As a result, the processing defects in the substrate can be reliably prevented.

(5) The platform may be a temperature control waiting unit that makes the substrate before the exposure processing by the exposure device wait until the substrate can be carried into the exposure device while keeping the substrate at a predetermined temperature.

In this case, the temperature control waiting unit has the function of keeping the substrate at the predetermined temperature and the function of making the substrate wait until the substrate can be transported to the exposure device, thereby eliminating the necessity of providing a general substrate platform in which the substrate waits until it can be carried into the exposure device. This allows the number of transporting processes by the second transport unit to be reduced. As a result, throughput can be improved, and reliability can be improved because the number of access points for transportation by the second transport unit can be reduced.

(6) The second transport unit may include first and second holders that each hold the substrate, the first holder may hold, when the substrate before the exposure processing by the exposure device is transported, the substrate, and the second holder may hold, when the substrate after the exposure processing is transported, the substrate.

In this case, the first holder is used in transporting the substrate before the exposure processing, and the second holder is used in transporting the substrate immediately after the exposure processing. This prevents a liquid from adhering to the first holder even if the liquid adheres to the substrate in the exposure device. As a result, the liquid does not adhere to the substrate before the exposure processing, thereby reliably preventing the particles and the like in the atmosphere from adhering to the substrate before the exposure processing.

(7) The second holder may be provided below the first holder. In this case, even if the liquid drops from the second holder and the substrate held thereby, the liquid does not adhere to the first holder and the substrate held thereby. This can reliably prevent the liquid from adhering to the substrate before the exposure processing.

Other features, elements, characteristics, and advantages of the present invention will become more apparent from the following description of preferred embodiments of the present invention with reference to the attached drawings.

BRIEF DESCRIPTION OF THE DRAWINGS

FIG. 7 is a schematic view showing a nozzle for cleaning processing and a nozzle for drying processing that are integrally formed;

FIG. 10 is a schematic view showing another example of a nozzle for drying processing;

DESCRIPTION OF THE PREFERRED EMBODIMENTS

A substrate processing apparatus according to embodiments of the present invention will be described with reference to the drawings. In the following description, a substrate refers to a semiconductor substrate, a substrate for a liquid crystal display, a substrate for a plasma display, a glass substrate for a photomask, a substrate for an optical disk, a substrate for a magnetic disk, a substrate for a magneto-optical disk, a substrate for a photomask, or the like.

(1) Configuration of Substrate Processing Apparatus

Figure 1:
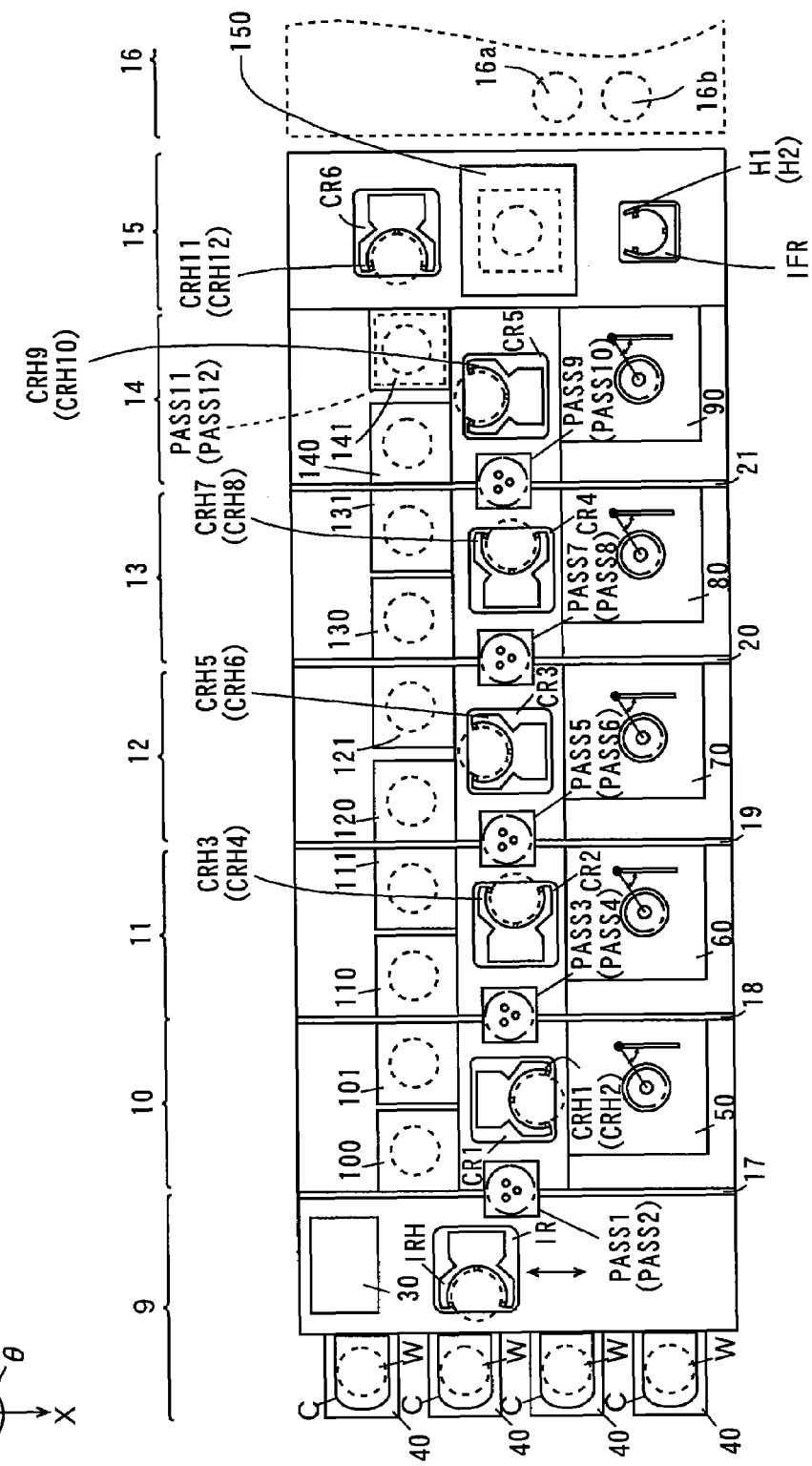
FIG. 1 is a plan view of a substrate processing apparatus according to a first embodiment of the present invention.

FIG. 1 is a plan view of a substrate processing apparatus according to a first embodiment of the present invention. FIG. 1 and FIGS. 2 to 4 described later are accompanied by arrows that respectively indicate X, Y, and Z directions perpendicular to one another for clarity of a positional relationship. The X and Y directions are perpendicular to each other within a horizontal plane, and the Z direction corresponds to a vertical direction. In each of the directions, the direction of an arrow is defined as a + direction, and the opposite direction is defined as a − direction. A rotation direction centered around the Z direction is defined as a θ direction.

As shown in FIG. 1, a substrate processing apparatus 500 comprises an indexer block 9, an anti-reflection film processing block 10, a resist film processing block 11, a development processing block 12, a resist cover film processing block 13, a resist cover film removal block 14, and an interface block 15. An exposure device 16 is arranged adjacent to the interface block 15. The exposure device 16 subjects a substrate W to exposure processing by means of a liquid immersion method.

Each of the indexer block 9, the anti-reflection film processing block 10, the resist film processing block 11, the development processing block 12, the resist cover film processing block 13, the resist cover film removal block 14, and the interface block 15 will be hereafter referred to as a processing block.

The indexer block 9 comprises a main controller (controller) 30 for controlling the operation of each of the processing blocks, a plurality of carrier platforms 40, and an indexer robot IR. The indexer robot IR has a hand IRH provided for receiving and transferring the substrates W.

The anti-reflection film processing block 10 comprises thermal processing groups 100 and 101 for anti-reflection film, a coating processing group 50 for anti-reflection film, and a first central robot CR1. The coating processing group 50 is arranged opposite to the thermal processing groups 100 and 101 with the first central robot CR1 sandwiched therebetween. The first central robot CR1 has hands CRH1 and CRH2 provided one above the other for receiving and transferring the substrates W.

A partition wall 17 is provided between the indexer block 9 and the anti-reflection film processing block 10 for shielding an atmosphere. The partition wall 17 has substrate platforms PASS1 and PASS2 provided in close proximity one above the other for receiving and transferring the substrates W between the indexer block 9 and the anti-reflection film processing block 10. The upper substrate platform PASS1 is used in transporting the substrates W from the indexer block 9 to the anti-reflection film processing block 10, and the lower substrate platform PASS2 is used in transporting the substrates W from the anti-reflection film processing block 10 to the indexer block 9.

Each of the substrate platforms PASS1 and PASS2 is provided with an optical sensor (not shown) for detecting the presence or absence of the substrate W. This allows determination to be made whether or not the substrate W is placed on the substrate platform PASS1 or PASS2. In addition, each of the substrate platforms PASS1 and PASS2 has a plurality of support pins secured thereto. Note that each of substrate platforms PASS3 to PASS12 described later is similarly provided with an optical sensor and support pins.

The resist film processing block 11 comprises thermal processing groups 110 and 111 for resist film, a coating processing group 60 for resist film, and a second central robot CR2. The coating processing group 60 is provided opposite to the thermal processing groups 110 and 111 with the second central robot CR2 sandwiched therebetween. The second central robot CR2 has hands CRH3 and CRH4 provided one above the other for receiving and transferring the substrates W.

A partition wall 18 is provided between the anti-reflection film processing block 10 and the resist film processing block 11 for shielding an atmosphere. The partition wall 18 has substrate platforms PASS3 and PASS4 provided in close proximity one above the other for receiving and transferring the substrates W between the anti-reflection film processing block 10 and the resist film processing block 11. The upper substrate platform PASS3 is used in transporting the substrates W from the anti-reflection film processing block 10 to the resist film processing block 11, and the lower substrate platform PASS4 is used in transporting the substrates W from the resist film processing block 11 to the anti-reflection film processing block 10.

The development processing block 12 comprises thermal processing groups 120 and 121 for development, a development processing group 70, and a third central robot CR3. The development processing group 70 is provided opposite to the thermal processing groups 120 and 121 with the third central robot CR3 sandwiched therebetween. The third central robot CR3 has hands CRH5 and CRH6 provided one above the other for receiving and transferring the substrates W.

A partition wall 19 is provided between the resist film processing block 11 and the development processing block 12 for shielding an atmosphere. The partition wall 19 has substrate platforms PASS5 and PASS6 provided in close proximity one above the other for receiving and transferring the substrates W between the resist film processing block 11 and the development processing block 12. The upper substrate platform PASS5 is used in transporting the substrates W from the resist film processing block 11 to the development processing block 12, and the lower substrate platform PASS6 is used in transporting the substrates W from the development processing block 12 to the resist film processing block 11.

The resist cover film processing block 13 comprises thermal processing groups 130 and 131 for resist cover film, a coating processing group 80 for resist cover film, and a fourth central robot CR4. The coating processing group 80 is provided opposite to the thermal processing groups 130 and 131 with the fourth central robot CR4 sandwiched therebetween. The fourth central robot CR4 has hands CRH7 and CRH8 provided one above the other for receiving and transferring the substrates W.

A partition wall 20 is provided between the development processing block 12 and the resist cover film processing block 13 for shielding an atmosphere. The partition wall 20 has substrate platforms PASS7 and PASS8 provided in close proximity one above the other for receiving and transferring the substrates W between the development processing block 12 and the resist cover film processing block 13. The upper substrate platform PASS7 is used in transporting the substrates W from the development processing block 12 to the resist cover film processing block 13, and the lower substrate platform PASS8 is used in transporting the substrates W from the resist cover film processing block 13 to the development processing block 12.

The resist cover film removal block 14 comprises thermal processing groups 140 and 141 for post-exposure bake, a removal processing group 90 for resist cover film, and a fifth central robot CR5. The thermal processing group 141 is adjacent to the interface block 15, and comprises substrate platforms PASS11 and PASS12, as described later. The removal processing group 90 is provided opposite to the thermal processing groups 140 and 141 with the fifth central robot CR5 sandwiched therebetween. The fifth central robot CR5 has hands CRH9 and CRH10 provided one above the other for receiving and transferring the substrates W.

A partition wall 21 is arranged between the resist cover film processing block 13 and the resist cover film removal block 14 for shielding an atmosphere. The partition wall 21 has substrate platforms PASS9 and PASS10 provided in close proximity one above the other for receiving and transferring the substrates W between the resist cover film processing block 13 and the resist cover film removal block 14. The upper substrate platform PASS9 is used in transporting the substrates W from the resist cover film processing block 13 to the resist cover film removal block 14, and the lower substrate platform PASS10 is used in transporting the substrates W from the resist cover film removal block 14 to the resist cover film processing block 13.

The interface block 15 comprises a sixth central robot CR6, a substrate replacement group 150, and an interface transport mechanism IFR. The sixth central robot CR6 has hands CRH11 and CRH12 (see FIG. 4) provided one above the other for receiving and transferring the substrates W, and the interface transport mechanism IFR has hands H1 and H2 (see FIG. 4) provided one above the other for receiving and transferring the substrates W. The details of the interface block 15 will be described later.

In the substrate processing apparatus 500 according to the present embodiment, the indexer block 9, the anti-reflection film processing block 10, the resist film processing block 11, the development processing block 12, the resist cover film processing block 13, the resist cover film removal block 14, and the interface block 15 are provided side by side in this order in the Y direction.

Figure 2:
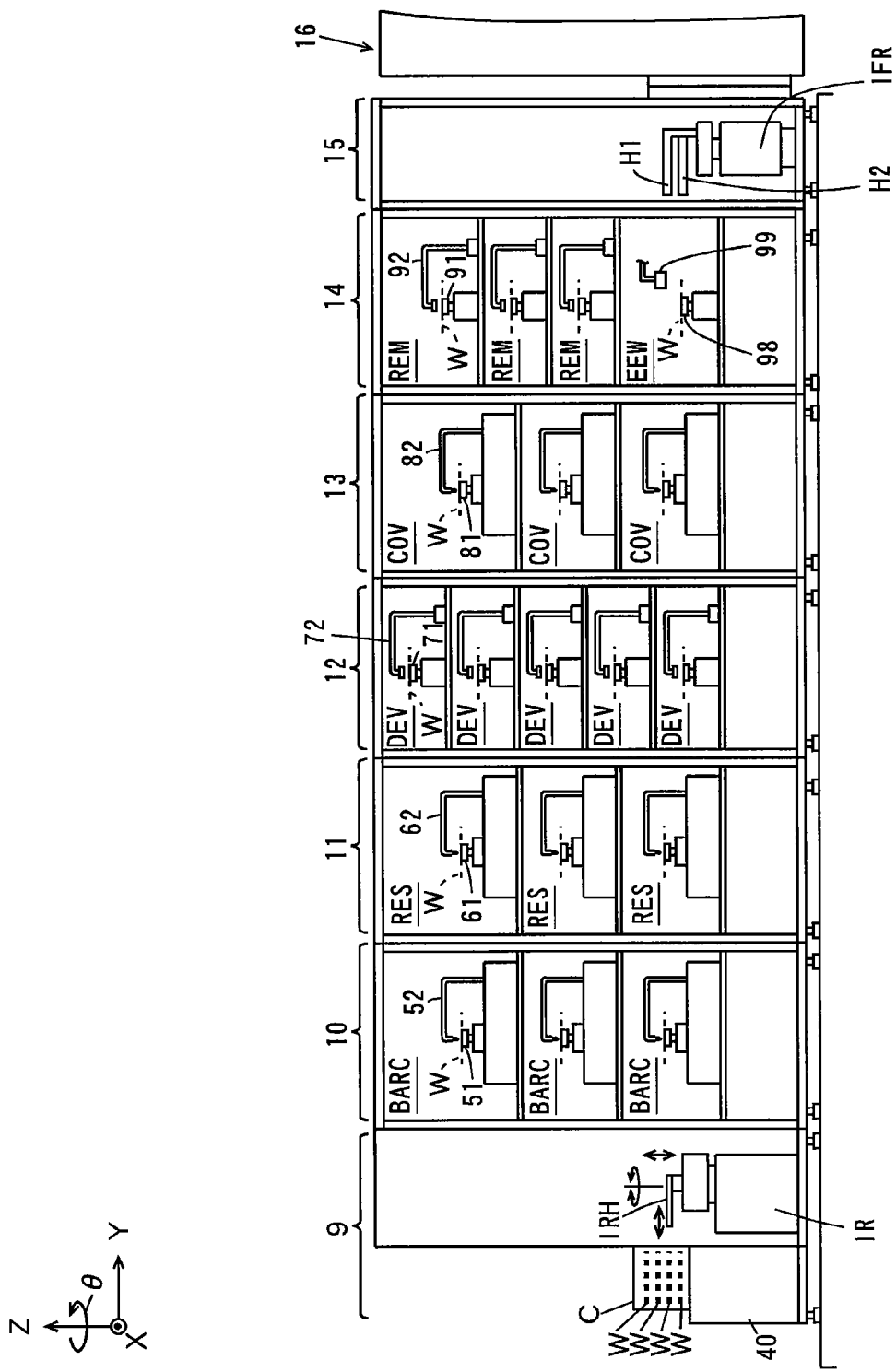
FIG. 2 is a schematic side view of the substrate processing apparatus shown in FIG. 1 as viewed from the +X direction.
Figure 3:
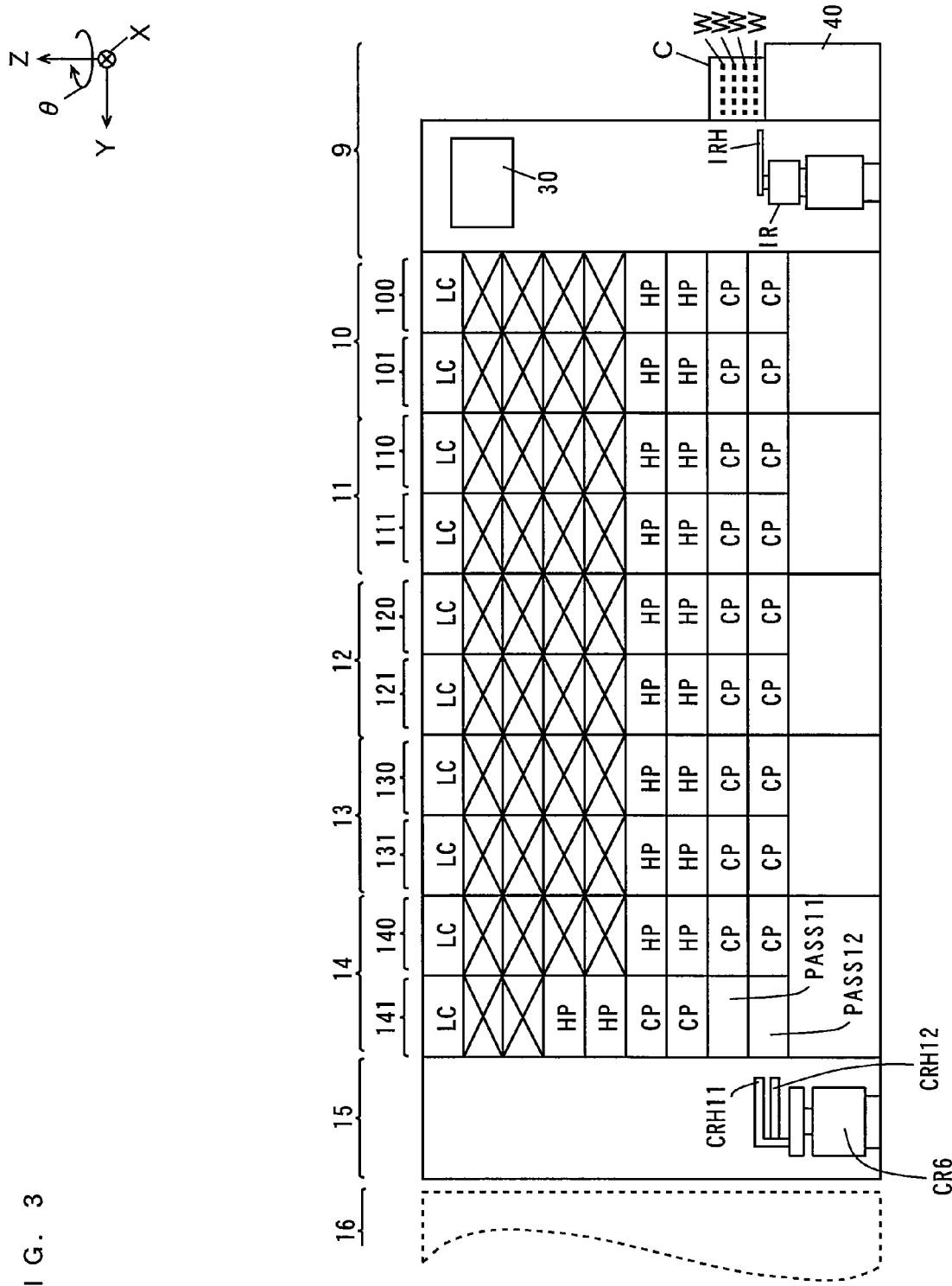
FIG. 3 is a schematic side view of the substrate processing apparatus shown in FIG. 1 as viewed from the −X direction.

FIG. 2 is a schematic side view of the substrate processing apparatus 500 shown in FIG. 1 as viewed from the +X direction, and FIG. 3 is a schematic side view of the substrate processing apparatus 500 shown in FIG. 1 as viewed from the −X direction. FIG. 2 mainly shows the configuration on the +X side of the substrate processing apparatus 500, and FIG. 3 mainly shows the configuration on the −X side of the substrate processing apparatus 500.

Description is first made of the configuration on the +X side of the substrate processing apparatus 500 using FIG. 2. As shown in FIG. 2, the coating processing group 50 (see FIG. 1) in the anti-reflection film processing block 10 has a vertical stack of three coating units BARC. Each of the coating units BARC comprises a spin chuck 51 for rotating the substrate W with the substrate W held in a horizontal attitude by suction, and a supply nozzle 52 for supplying a coating liquid for an anti-reflection film to the substrate W held on the spin chuck 51.

The coating processing group 60 in the resist film processing block 11 (see FIG. 1) has a vertical stack of three coating units RES. Each of the coating units RES comprises a spin chuck 61 for rotating the substrate W with the substrate W held in a horizontal attitude by suction, and a supply nozzle 62 for supplying a coating liquid for a resist film to the substrate W held on the spin chuck 61.

The development processing group 70 in the development processing block 12 has a vertical stack of five development processing units DEV. Each of the development processing units DEV comprises a spin chuck 71 for rotating the substrate W with the substrate W held in a horizontal attitude by suction, and a supply nozzle 72 for supplying a development liquid to the substrate W held on the spin chuck 71.

The coating processing group 80 in the resist cover film processing block 13 has a vertical stack of three coating units COV. Each of the coating units COV comprises a spin chuck 81 for rotating the substrate W with the substrate W held in a horizontal attitude by suction, and a supply nozzle 82 for supplying a coating liquid for a resist cover film to the substrate W held on the spin chuck 81. Materials having a low affinity for resists and water (materials having low reactivity to resists and water) can be used as the coating liquid for the resist cover film. An example of the coating liquid is fluororesin. Each of the coating units COV forms the resist cover film on the resist film formed on the substrate W by applying the coating liquid onto the substrate W while rotating the substrate W.

The removal processing group 90 in the resist cover film removal block 14 has a vertical stack of three removal units REM and one edge exposure unit EEW. Each of the removal units REM comprises a spin chuck 91 for rotating the substrate W with the substrate W held in a horizontal attitude by suction, and a supply nozzle 92 for supplying a stripping liquid (e.g. fluororesin) to the substrate W held on the spin chuck 91.

Each of the removal units REM removes the resist cover film formed on the substrate W by applying the stripping liquid onto the substrate W while rotating the substrate W. The edge exposure unit EEW comprises a spin chuck 98 for rotating the substrate W with the substrate held in a horizontal attitude by suction, and a light irradiator 99 for exposing a peripheral portion of the substrate W held on the spin chuck 98.

Note that a method of removing the resist cover films in the removal units REM is not limited to the above-mentioned example. For example, the resist cover film may be removed by supplying the stripping liquid onto the substrate W while moving a slit nozzle above the substrate W.

Description is now made of the configuration on the −X side of the substrate processing apparatus 500 using FIG. 3. As shown in FIG. 3, each of the thermal processing groups 100 and 101 in the anti-reflection film processing block 10 has a stack of two heating units (hot plates) HP and two cooling units (cooling plates) CP. Each of the thermal processing groups 100 and 101 also has a local controller LC for controlling the temperatures of the heating units HP and the cooling units CP arranged in its uppermost part.

Each of the thermal processing groups 110 and 111 in the resist film processing block 11 has a stack of two heating units HP and two cooling units CP. Each of the thermal processing groups 110 and 111 also has a local controller LC for controlling the temperatures of the heating units HP and the cooling units CP arranged in its uppermost part.

Each of the thermal processing groups 120 and 121 in the development processing block 12 has a stack of two heating units HP and two cooling units CP. Each of the thermal processing groups 120 and 121 also has a local controller LC for controlling the temperatures of the heating units HP and the cooling units CP arranged in its uppermost part.

Each of the thermal processing groups 130 and 131 in the resist cover film processing block 13 has a stack of two heating units HP and two cooling units CP. Each of the thermal processing groups 130 and 131 also has a local controller LC for controlling the temperatures of the heating units HP and the cooling units CP arranged in its uppermost part.

In the resist cover film removal block 14, the thermal processing group 140 has a vertical stack of two heating units HP and two cooling units CP, and the thermal processing group 141 has a vertical stack of two heating units HP, two cooling units CP, and substrate platforms PASS11 and PASS12. Each of the thermal processing groups 140 and 141 has a local controller LC for controlling the temperatures of the heating units HP and the cooling units CP arranged in its uppermost part.

Figure 4:
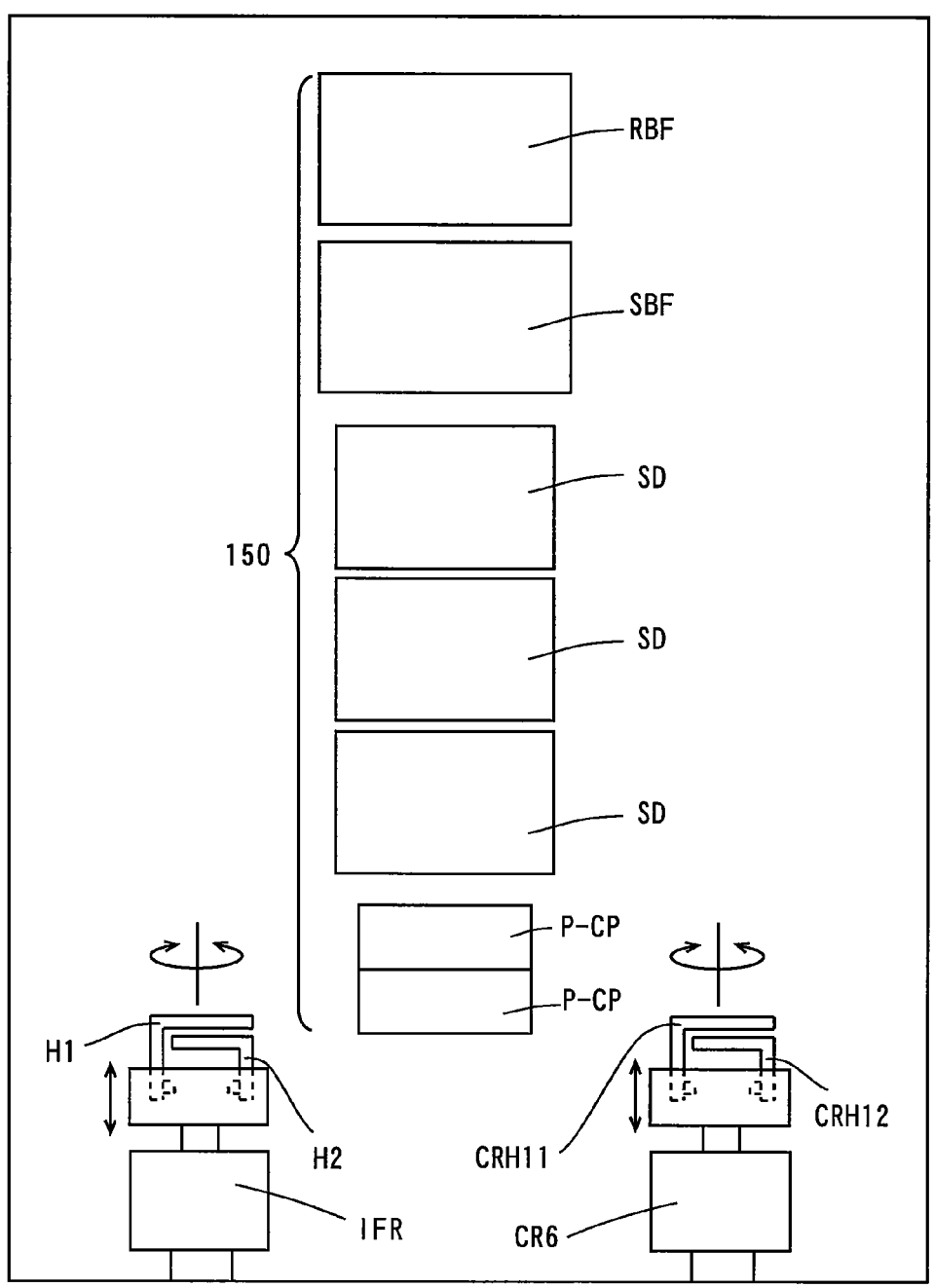
FIG. 4 is a schematic side view of an interface block as viewed from the +Y side.

The interface block 15 will be then described in detail using FIG. 4.

FIG. 4 is a schematic side view of the interface block 15 as viewed from a +Y side. As shown in FIG. 4, the substrate replacement group 150 (see FIG. 1) provided at a substantially central portion of the interface block 15 has a stack of a return buffer unit RBF, a sending buffer unit SBF, three cleaning/drying processing units SD, and two placement/cooling units PASS-CP (hereinafter abbreviated as P-CP).

The interface block 15 has a sixth central robot CR6 provided in its lower part on the −X side. The sixth central robot CR6 is provided so as to be vertically movable and rotatable on the −X side of the substrate replacement group 150.

The interface block 15 has an interface transport mechanism IFR provided in its lower part on the +X side. The interface transport mechanism IFR is provided so as to be vertically movable and rotatable on the +X side of the substrate replacement group 150.

(2) Operation of Substrate Processing Apparatus

The operation of the substrate processing apparatus 500 according to the present embodiment will be then described with reference to FIGS. 1 to 4.

(2-1) Operation of Indexer Block to Resist Cover Film Removal Block

First, the operation of the indexer block 9 to the resist cover film removal block 14 will be briefly described.

Carriers C that store a plurality of substrates W in multiple stages are respectively carried onto the carrier platforms 40 in the indexer block 9. The indexer robot IR takes out the unprocessed substrate W that is stored in the carrier C using the hand IRH. Thereafter, the indexer robot IR rotates in the ±θ direction while moving in the ±X direction, to place the unprocessed substrate W on the substrate platform PASS1.

Although FOUPs (Front Opening Unified Pods) are adopted as the carriers C in the present embodiment, the present invention is not limited to the same. For example, SMIF (Standard Mechanical Inter Face) pods, or OCs (Open-Cassettes) that expose the stored substrates W to outside air may be used.

Furthermore, although linear-type transport robots that move their hands forward or backward by linearly sliding them to the substrate W are respectively used as the indexer robot IR, the first to sixth central robots CR1 to CR6, and the interface transport mechanism IFR, the present invention is not limited to the same. For example, multi-joint type transport robots that linearly move their hands forward and backward by moving their joints may be used.

The unprocessed substrate W placed on the substrate platform PASS1 is received by the first central robot CR1 in the anti-reflection film processing block 10. The first central robot CR1 carries the substrate W into the thermal processing group 100 or 101.

Thereafter, the first central robot CR1 takes out the thermally processed substrate W from the thermal processing group 100 or 101 and carries the substrate W into the coating processing group 50. The coating processing group 50 forms a coating of an anti-reflection film on the substrate W using the coating unit BARC in order to reduce standing waves and halation generated during the exposure processing.

The first central robot CR1 then takes out the substrate W after the coating processing from the coating processing group 50 and carries the substrate W into the thermal processing group 100 or 101. Thereafter, the first central robot CR1 takes out the thermally processed substrate W from the thermal processing group 100 or 101 and places the substrate W on the substrate platform PASS3.

The substrate W placed on the substrate platform PASS3 is received by the second central robot CR2 in the resist film processing block 11. The second central robot CR2 carries the substrate W into the thermal processing group 110 or 110.

Thereafter, the second central robot CR2 takes out the thermally processed substrate W from the thermal processing group 110 or 111 and carries the substrate W into the coating processing group 60. The coating processing group 60 forms a coating of a resist film on the substrate W that has been coated with the anti-reflection film using the coating unit RES.

The second central robot CR2 then takes out the substrate W after the coating processing from the coating processing group 60 and carries the substrate W into the thermal processing group 110 or 111. Thereafter, the second central robot CR2 takes out the thermally processed substrate W from the thermal processing group 110 or 111 and places the substrate W on the substrate platform PASS5.

The substrate W placed on the substrate platform PASS5 is received by the third central robot CR3 in the development processing block 12. The third central robot CR3 places the substrate W on the substrate platform PASS7.

The substrate W placed on the substrate platform PASS7 is received by the fourth central robot CR4 in the resist cover film processing block 13. The fourth central robot CR4 carries the substrate W into the coating processing group 80. The coating processing group 80 forms a coating of a resist cover film on the substrate W that has been coated with the resist film using the coating unit COV.

The fourth central robot CR4 then takes out the substrate W after the coating processing from the coating processing group 80 and carries the substrate W into the thermal processing group 130 or 131. Thereafter, the fourth central robot CR4 takes out the thermally processed substrate W from the thermal processing group 130 or 131 and places the substrate W on the substrate platform PASS9.

The substrate W placed on the substrate platform PASS9 is received by the fifth central robot CR5 in the resist cover film removal block 14. The fifth central robot CR5 carries the substrate W into the edge exposure unit EEW (FIG. 2). In the edge exposure unit EEW, a peripheral portion of the substrate W is subjected to the exposure processing.

The fifth central robot CR5 then takes out the substrate W after the exposure processing from the edge exposure unit EEW and places the substrate W on the substrate platform PASS11.

The substrate W placed on the substrate platform PASS11 is received by the sixth central robot CR6 in the interface block 15, and is subjected to predetermined processing in the interface block 15 and the exposure device 16, as described later. After the substrate W is subjected to the predetermined processing in the interface block 15 and the exposure device 16, the sixth central robot CR6 carries the substrate W into the thermal processing group 141 in the resist cover film removal block 14.

In the thermal processing group 141, the substrate W is subjected to post-exposure bake (PEB). Thereafter, the sixth central robot CR6 takes out the substrate W from the thermal processing group 141 and places the substrate W on the substrate platform PASS12.

Although the substrate W is subjected to the post-exposure bake by the thermal processing group 141 in the present embodiment, the substrate W may be subjected to post-exposure bake by the thermal processing group 140.

The substrate W placed on the substrate platform PASS12 is received by the fifth central robot CR5 in the resist cover film removal block 14. The fifth central robot CR5 carries the substrate W into the removal processing group 90. In the removal processing group 90, the resist cover film is removed.

The fifth central robot CR5 then takes out the processed substrate W from the removal processing group 90 and places the substrate W on the substrate platform PASS10.

The substrate W placed on the substrate platform PASS10 is placed on the substrate platform PASS8 by the fourth central robot CR4 in the resist cover film processing block 13.

The substrate W placed on the substrate platform PASS8 is received by the third central robot CR3 in the development processing block 12. The third central robot CR3 carries the substrate W into the development processing group 70. In the development processing group 70, the exposed substrate W is subjected to development processing.

The third central robot CR3 then takes out the substrate W after the development processing from the development processing group 70 and carries the substrate W into the thermal processing group 120 or 121. Thereafter, the third central robot CR3 takes out the thermally processed substrate W from the thermal processing group 120 or 121 and places the substrate W on the substrate platform PASS6.

The substrate W placed on the substrate platform PASS6 is placed on the substrate platform PASS4 by the second central robot CR2 in the resist film processing block 11. The substrate W placed on the substrate platform PASS4 is placed on the substrate platform PASS2 by the first central robot CR1 in the anti-reflection film processing block 10.

The substrate W placed on the substrate platform PASS2 is stored in the carrier C by the indexer robot IR in the indexer block 9. Each processing for the substrate W in the substrate processing apparatus 500 is thus terminated.

(2-2) Operation of Interface Block

The operation of the interface block 15 will be then described.

As described in the foregoing, the substrate W carried into the indexer block 9 is subjected to predetermined processing, and is then placed on the substrate platform PASS11 in the resist cover film removal block 14 (FIG. 1).

The substrate W placed on the substrate platform PASS11 is received by the sixth central robot CR6 in the interface block 15.

Here, a time period for the exposure processing by the exposure device 16 is ordinarily longer than those for other processing and transporting processes. As a result, the exposure device 16 cannot accept the subsequent substrates W in many cases. In this case, the substrate W is temporarily stored in the sending buffer unit SBF (FIG. 4). In the present embodiment, the sixth central robot CR6 takes out the substrate W from the substrate platform PASS11 and transports the substrate W to the sending buffer unit SBF.

The sixth central robot CR6 then takes out the substrate W stored in the sending buffer unit SBF and carries the substrate W into either one of the placement/cooling units P-CP. The substrate W carried into the placement/cooling unit P-CP is kept at the same temperature as that in the exposure device 16 (for example, 23° C.).

In a case where the exposure device 16 has a sufficient processing speed, the substrate W may not be stored in the sending buffer unit SBF but transported to the placement/cooling unit P-CP from the substrate platform PASS11.

The substrate W kept at the above-mentioned predetermined temperature in the placement/cooling unit P-CP is then received with the upper hand H1 of the interface transport mechanism IFR (FIG. 4) and carried into a substrate inlet 16a in the exposure device 16 (FIG. 1).

The substrate W that has been subjected to the exposure processing in the exposure device 16 is carried out of the substrate outlet 16b (FIG. 1) with the lower hand H2 of the interface transport mechanism IFR (FIG. 4). The interface transport mechanism IFR carries the substrate W into any one of the cleaning/drying processing units SD with the hand H2. In the cleaning/drying processing unit SD, the substrate W after the exposure processing is subjected to cleaning and drying processing.

The substrate W that has been subjected to the cleaning and drying processing in the cleaning/drying processing unit SD is taken out by the sixth central robot CR6. The sixth central robot CR6 transports the substrate W to the thermal processing group 141 in the resist cover film removal block 14 (FIG. 1).

From the foregoing, the processing in the interface block 15 is terminated.

When the resist cover film removal block 14 cannot temporarily receive the substrate W due to a failure or the like in the removal unit REM (FIG. 2), the substrate W after the exposure processing can be temporarily stored in the return buffer unit RBF.

(3) Cleaning/Drying Processing Unit

The cleaning/drying processing unit SD will be then described in detail using the drawings.

(3-1) Configuration

Figure 5:
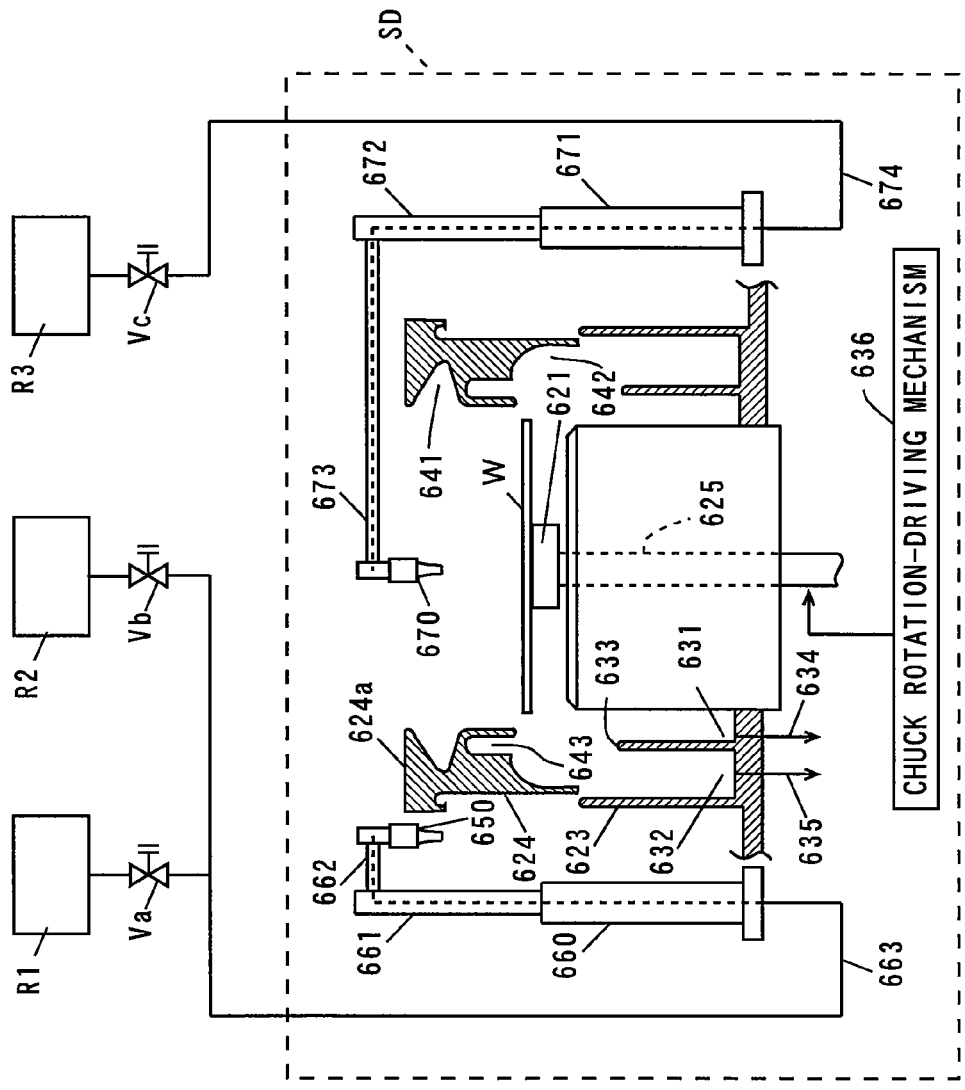
FIG. 5 is a diagram for explaining the configuration of a cleaning/drying processing unit.

FIG. 5 is a diagram for explaining the configuration of the cleaning/drying processing unit SD. As shown in FIG. 5, the cleaning/drying processing unit SD comprises a spin chuck 621 for horizontally holding the substrate W as well as rotating the substrate W around a vertical rotation shaft passing through the center of the substrate W.

The spin chuck 621 is secured to an upper end of a rotation shaft 625, which is rotated by a chuck rotation-driving mechanism 636. An air suction passage (not shown) is formed in the spin chuck 621. Air inside the air suction passage is exhausted with the substrate W placed on the spin chuck 621, so that a lower surface of the substrate W is adsorbed on the spin chuck 621 under vacuum, and the substrate W can be held in a horizontal attitude.

A first rotation motor 660 is provided outside the spin chuck 621. A first rotation shaft 661 is connected to the first rotation motor 660. A first arm 662 is connected to the first rotation shaft 661 so as to extend in the horizontal direction, and it send is provided with a nozzle 650 for cleaning processing.

The first rotation motor 660 causes the first rotation shaft 661 to rotate while causing the first arm 662 to swing, which causes the nozzle 650 to move to above the substrate W held on the spin chuck 621.

A supply pipe 663 for cleaning processing is provided so as to pass through the first rotation motor 660, the first rotation shaft 661, and the first arm 662. The supply pipe 663 is connected to a cleaning liquid supply source R1 and a rinse liquid supply source R2 through a valve Va and a valve Vb, respectively.

By controlling the opening and closing of the valves Va and Vb, it is possible to select a processing liquid supplied to the supply pipe 663 and adjust the amount of the processing liquid to be supplied. In the configuration shown in FIG. 5, a cleaning liquid can be supplied to the supply pipe 663 by opening the valve Va, and a rinse liquid can be supplied to the supply pipe 663 by opening the valve Vb.

The cleaning liquid and the rinse liquid are supplied to the nozzle 650 through the supply pipe 663 from the cleaning liquid supply source R1 and the rinse liquid supply source R2, respectively. The cleaning liquid or the rinse liquid can be thus supplied to a main surface of the substrate W. Examples of the cleaning liquid include pure water, a pure water solution containing a complex (ionized), or a fluorine-based chemical solution. Examples of the rinse liquid may include pure water, carbonated water, hydrogen water, electrolytic ionic water, and HFE (hydrofluoroether).

A second rotation motor 671 is provided outside the spin chuck 621. A second rotation shaft 672 is connected to the second rotation motor 671. A second arm 673 is connected to the second rotation shaft 672 so as to extend in the horizontal direction, and its end is provided with a nozzle 670 for drying processing.

The second rotation motor 671 causes the second rotation shaft 672 to rotate while causing the second arm 673 to swing, which causes the nozzle 670 to move to above the substrate W held on the spin chuck 621.

A supply pipe 674 for drying processing is provided so as to pass through the second rotation motor 671, the second rotation shaft 672, and the second arm 673. The supply pipe 674 is connected to an inert gas supply source R3 through a valve Vc. By controlling the opening and closing of the valve Vc, it is possible to adjust the amount of the inert gas supplied to the supply pipe 674.

The inert gas is supplied to the nozzle 670 through the supply pipe 674 from the inert gas supply source R3. The inert gas can be thus supplied to the main surface of the substrate W. An example of the inert gas is nitrogen gas.

When supplying the cleaning liquid or the rinse liquid to the main surface of the substrate W, the nozzle 650 is positioned above the substrate W. When supplying the inert gas to the main surface of the substrate W, the nozzle 650 is retracted to a predetermined position.

When supplying the cleaning liquid or the rinse liquid to the main surface of the substrate W, the nozzle 670 is retracted to a predetermined position. When supplying the inert gas to the main surface of the substrate W, the nozzle 670 is positioned above the substrate W.

The substrate W held on the spin chuck 621 is stored in a processing cup 623. A cylindrical partition wall 633 is provided inside the processing cup 623. A discharge space 631 for discharging the processing liquid (i.e., cleaning liquid or rinse liquid) used for processing the substrate W is formed so as to surround the spin chuck 621. Further, a liquid recovery space 632 for recovering the processing liquid used for processing the substrate W is formed between the processing cup 623 and the partition wall 633 so as to surround the discharge space 631.

A discharge pipe 634 for introducing the processing liquid into a liquid discharge processing device (not shown) is connected to the discharge space 631. A recovery pipe 635 for introducing the processing liquid into a recovery processing device (not shown) is connected to the liquid recovery space 632.

A guard 624 is provided above the processing cup 623 for preventing the processing liquid on the substrate W from being splashed outward. The guard 624 is shaped to be rotationally-symmetric with respect to the rotation shaft 625. An annular-shaped liquid discharge guide groove 641 with a V-shaped cross section is formed inwardly at an upper end of the guard 624.

Furthermore, a liquid recovery guide 642 having an inclined surface that is inclined outwardly downward is formed inwardly at a lower end of the guard 624. A partition wall housing groove 643 for receiving the partition wall 633 in the processing cup 623 is formed in the vicinity of an upper end of the liquid recovery guide 642.

This guard 624 is provided with a guard lifting mechanism (not shown) composed of a ball-screw mechanism or the like. The guard lifting mechanism moves the guard 624 upward and downward between a recovery position in which the liquid recovery guide 642 is opposed to outer edges of the substrate W held on the spin chuck 621 and a discharge position in which the liquid discharge guide groove 641 is opposed to the outer edges of the substrate W held on the spin chuck 621. When the guard 624 is in the recovery position (i.e., the position of the guard 624 shown in FIG. 5), the processing liquid splashed outward from the substrate W is introduced into the liquid recovery space 632 by the liquid recovery guide 642, and then recovered through the recovery pipe 635. On the other hand, when the guard 624 is in the discharge position, the processing liquid splashed outward from the substrate W is introduced into the discharge space 631 by the liquid discharge guide groove 641, and then discharged through the discharge pipe 634. The foregoing configuration causes the processing liquid to be discharged and recovered.

(3-2) Operation

The processing operation of the cleaning/drying processing unit SD having the above-mentioned configuration will be then described. Note that the operation of each constituent element in the cleaning/drying processing unit SD described below is controlled by the main controller (controller) 30 shown in FIG. 1.

When the substrate W is first carried into the cleaning/drying processing unit, the guard 624 is lowered, and the interface transport mechanism IFR shown in FIG. 1 places the substrate W on the spin chuck 621. The substrate W placed on the spin chuck 621 is held by suction on the spin chuck 621.

Then, the guard 624 moves to the above-mentioned discharge position while the nozzle 650 moves to above the center of the substrate W. Then, the rotation shaft 625 rotates, which causes the substrate W held on the spin chuck 621 to rotate. Thereafter, the cleaning liquid is discharged onto an upper surface of the substrate W from the nozzle 650. The substrate W is thus cleaned.

After an elapse of a predetermined time period, the supply of the cleaning liquid is stopped, and the rinse liquid is discharged from the nozzle 650. This causes the cleaning liquid on the substrate W to be cleaned away.

Figure 6:
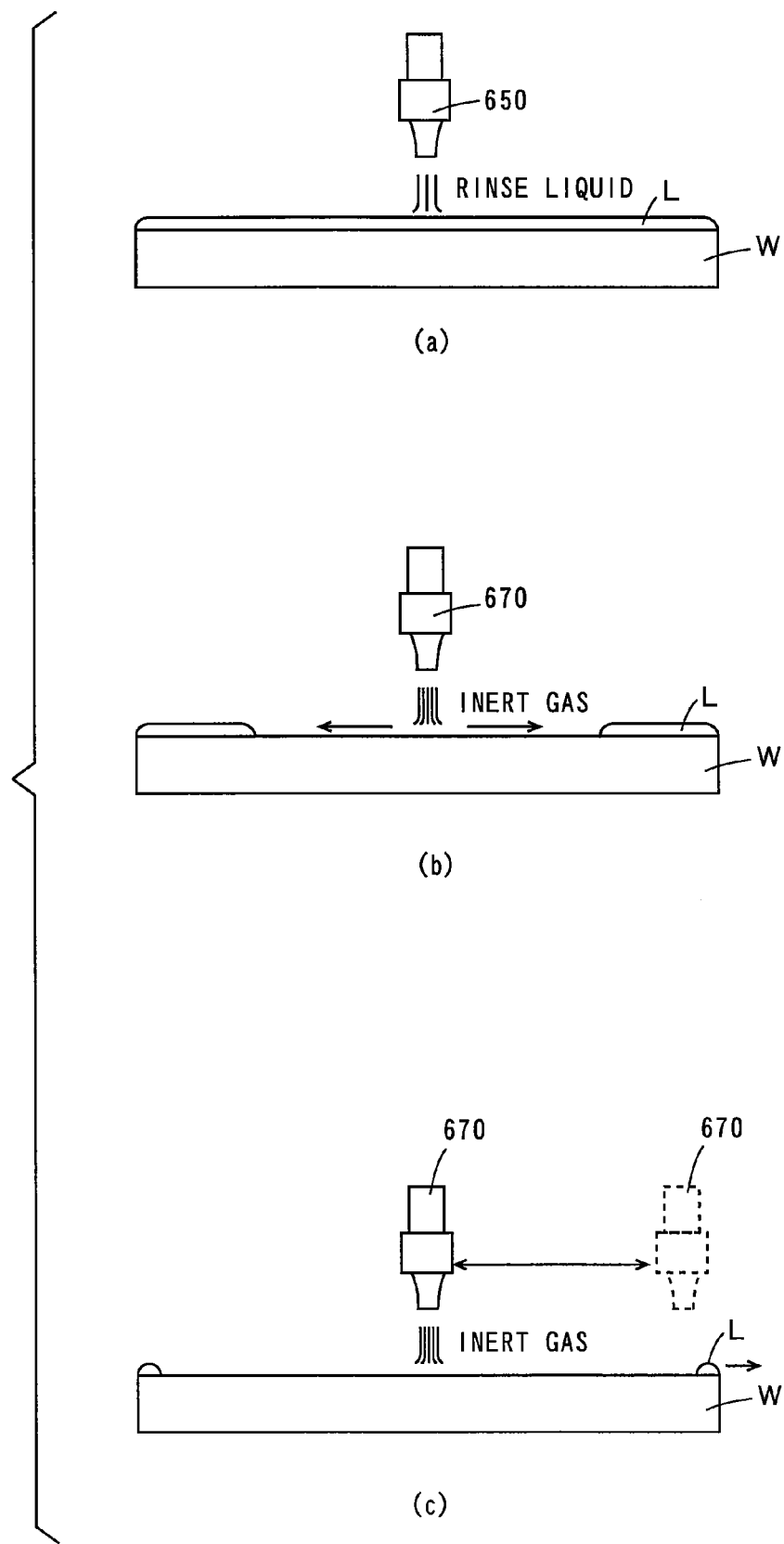
FIG. 6 is a diagram for explaining the operation of the cleaning/drying processing unit.

After an elapse of another predetermined time period, the rotation speed of the rotation shaft 625 decreases. This causes the amount of the rinse liquid that is shaken off by the rotation of the substrate W to be reduced, so that a liquid layer L of the rinse liquid is formed over the entire main surface of the substrate W, as shown in FIG. 6 (*a*). Alternatively, the liquid layer L may be formed over the entire main surface of the substrate W by stopping the rotation of the rotation shaft 625.

Then, the supply of the rinse liquid is stopped, and the nozzle 650 is retracted to the predetermined position while the nozzle 670 moves to above the center of the substrate W. Thereafter, the inert gas is discharged from the nozzle 670. This causes the rinse liquid at the center of the substrate W to move to the peripheral portion of the substrate W, leaving the liquid layer L only on the peripheral portion of the substrate W, as shown in FIG. 6 (*b*).

Then, as the number of revolutions of the rotation shaft 625 (see FIG. 5) increases, the nozzle 670 gradually moves from above the center of the substrate W to above the peripheral portion thereof, as shown in FIG. 6 (*c*). This causes a great centrifugal force to act on the liquid layer L on the substrate W while the inert gas can be sprayed on the entire main surface of the substrate W, thereby allowing the liquid layer L on the substrate W to be reliably removed. As a result, the substrate W can be reliably dried.

Then, the supply of the inert gas is stopped, and the nozzle 670 is retracted to the predetermined position while the rotation of the rotation shaft 625 is stopped. Thereafter, the guard 624 is lowered, and the sixth central robot CR6 shown in FIG. 1 carries the substrate W out of the cleaning/drying processing unit. The processing operation in the cleaning/drying processing unit SD is thus terminated. It is preferred that the position of the guard 624 during the cleaning and drying processing is suitably changed according to the necessity of recovering or discharging the processing liquid.

Although in the above-mentioned embodiment, a configuration in which the nozzle 650 is shared between the supply of the cleaning liquid and the supply of the rinse liquid is adopted to allow either one of the cleaning liquid and the rinse liquid to be supplied from the nozzle 650, a configuration in which different nozzles are respectively used for the supply of the cleaning liquid and the supply of the rinse liquid may be also adopted.

In a case where the rinse liquid is supplied, pure water may be supplied from a nozzle for a back rinse (not shown) to the back of the substrate W so as to prevent the rinse liquid from flowing around to the back of the substrate W.

In a case where pure water is used as the cleaning liquid for cleaning the substrate W, it is not necessary to supply the rinse liquid.

Although in the above-mentioned embodiment, the substrate W is subjected to the drying processing by a spin drying method, the substrate W may be also subjected to drying processing by other methods such as a reduced pressure drying method and an air knife drying method.

Although in the above-mentioned embodiment, the inert gas is supplied from the nozzle 670 with the liquid layer L of the rinse liquid formed, the inert gas may be supplied from the nozzle 670 to thoroughly dry the substrate W immediately after the liquid layer of the cleaning liquid is shaken off once by rotating the substrate W when the liquid layer L of the rinse liquid is not formed or the rinse liquid is not used.

(4) Effects According to the Embodiment (4-1) Effects of Drying Processing of Substrate After Exposure Processing As described in the foregoing, in the substrate processing apparatus 500 according to the present embodiment, the substrate W after the exposure processing is subjected to the drying processing in the cleaning/drying processing unit SD in the interface block 15. This prevents the liquid adhering to the substrate W during the exposure processing from dropping in the substrate processing apparatus 500.

Moreover, the particles and the like in the atmosphere are prevented from adhering to the substrate W after the exposure processing by subjecting the substrate W after the exposure processing to the drying processing, thereby preventing the substrate W from being contaminated.

Since the substrate W to which the liquid adheres is prevented from being transported in the substrate processing apparatus 500, it is possible to prevent the liquid adhering to the substrate W during the exposure processing from influencing the atmosphere in the substrate processing apparatus 500. This facilitates the adjustment of temperature and humidity in the substrate processing apparatus 500.

Since the liquid adhering to the substrate W during the exposure processing is prevented from adhering to the indexer robot IR and the first to sixth central robots CR1 to CR6, the liquid is prevented from adhering to the substrate W before the exposure processing. This prevents the particles and the like in the atmosphere from adhering to the substrate W before the exposure processing, thereby preventing the substrate W from being contaminated. As a result, this can prevent degradation in resolution performance during the exposure processing and can prevent contamination in the exposure device 16.

It is possible to reliably prevent the components of the resist or the resist cover film from being eluted in the cleaning liquid and the rinse liquid remaining on the substrate W while the substrate W is transported from the cleaning/drying processing unit SD to the development processing group 70. This can prevent exposure patterns formed on the resist film from being deformed. As a result, it is possible to reliably prevent line-width precision during the development processing from being degraded.

As a result, this prevents operational troubles such as abnormalities in an electric system of the substrate processing apparatus 500 while reliably preventing processing defects in the substrate W.

The cleaning/drying processing unit SD subjects the substrate W to the drying processing by spraying the inert gas on the substrate W from the center to the peripheral portion thereof while rotating the substrate W. In this case, the cleaning liquid and the rinse liquid on the substrate W can be reliably removed, which can reliably prevent the particles and the like in the atmosphere from adhering to the cleaned substrate W. It is thus possible to reliably prevent the contamination of the substrate W and the generation of dry marks on the main surface of the substrate W.

(4-2) Effects of Cleaning Processing of Substrate After Exposure Processing

In the cleaning/drying processing unit SD, the substrate W is subjected to the cleaning processing before the drying processing. In this case, even if the particles and the like in the atmosphere adhere to the substrate W to which the liquid adheres during the exposure processing, the attachment can be removed. This prevents the substrate W from being contaminated. As a result, it is possible to reliably prevent processing defects in the substrate.

(4-3) Effects of Coating Processing of Resist Cover Film

Before the substrate W is subjected to the exposure processing in the exposure device 16, the resist cover film is formed on the resist film in the resist cover film processing block 13. In this case, even if the substrate W is brought into contact with the liquid in the exposure device 16, the resist cover film prevents the resist film from coming into contact with the liquid, which prevents the component of the resist from being eluted in the liquid.

(4-4) Effects of Removal Processing of Resist Cover Film

Before the substrate W is subjected to the development processing in the development processing block 12, removal processing of the resist cover film is performed in the resist cover film removal block 14. In this case, the resist cover film is reliably removed before the development processing, which allows the development processing to be reliably performed.

(4-5) Effect of Interface Block

In the interface block 15, the sixth central robot CR6 carries the substrate W into and out of the sending buffer unit SBF, carries the substrate W into and out of the return buffer unit RBF, carries the substrate W into the placement/cooling unit P-CP, and carries the substrate W out of the cleaning/drying processing unit SD, and the interface transport mechanism IFR carries the substrate W out of the placement/cooling unit P-CP, carries the substrate W into and out of the exposure device 16, and carries the substrate W into the cleaning/ drying processing unit SD. In such a way, since the substrate W is efficiently transported by the sixth central robot CR6 and the interface transport mechanism IFR, throughput can be improved.

Furthermore, in the interface block 15, the cleaning/drying processing unit SD serves as a substrate platform on which the substrate W is to be placed in receiving and transferring the substrate W from the interface transport mechanism IFR to the sixth central robot CR6. Consequently, the necessity of separately providing the substrate platform for receiving and transferring the substrate W from the interface transport mechanism IFR to the sixth central robot R6 is eliminated, thereby allowing the configuration of the interface block 15 to be simplified. This allows the manufacturing cost of the substrate processing apparatus 500 to be reduced. Further, a transport path of the substrate W within the interface block 15 can be simplified, thereby allowing throughput to be improved. Further, the number of access points for transportation of the substrate W can be reduced, thereby simplifying the operation of the interface transport mechanism IFR.

(4-6) Effects of Interface Transport Mechanism

In the interface block 15, the hand H1 of the interface transport mechanism IFR is used in transporting the substrate W from the placement/cooling unit P-CP to the exposure device 16, and the hand H2 of the interface transport mechanism IFR is used in transporting the substrate from the exposure device 16 to the cleaning/drying processing unit SD.

That is to say, the hand H1 is used for transporting the substrate W having no liquid adhering thereto, and the hand H2 is used for transporting the substrate W having a liquid adhering thereto.

In this case, since the liquid adhering to the substrate W during the exposure processing is prevented from adhering to the hand H1, the liquid is prevented from adhering to the substrate W before the exposure processing. In addition, since the hand H2 is provided below the hand H1, the liquid can be prevented from adhering to the hand H1 and the substrate W held thereby even if the liquid drops from the hand H2 and the substrate W held thereby. This can reliably prevent the liquid from adhering to the substrate W before the exposure processing. As a result, the substrate W can be reliably prevented from being contaminated before the exposure processing.

(4-7) Effects of Provision of Placement/Cooling Unit P-CP

The interface block 15 is provided with the placement/cooling unit P-CP having both the function of placing the substrate W before the exposure processing by the exposure device 16 and the function of cooling the substrate W for adjusting the temperature of the substrate W to the temperature in the exposure device 16, thereby making it possible to reduce the number of transporting processes. When the exposure processing is performed by the liquid immersion method in which strict temperature control of the substrate is required, it is important to reduce the number of transporting processes.

As a result of the foregoing, throughput can be improved, and reliability can be also improved because the number of access points for transportation can be reduced.

In particular, the two placement/cooling units P-CP are provided, thereby making it possible to further improve the throughput.

(5) Other Examples of Cleaning/Drying Processing Unit

Although the nozzle 650 for cleaning processing and the nozzle 670 for drying processing are separately provided in the cleaning/drying processing unit shown in FIG. 5, the nozzle 650 and the nozzle 670 may be integrally formed, as shown in FIG. 7. In this case, the nozzle 650 and the nozzle 670 need not be separately moved when the substrate W is subjected to the cleaning processing or the drying processing, thereby making it possible to simplify the driving mechanism.

Figure 8:
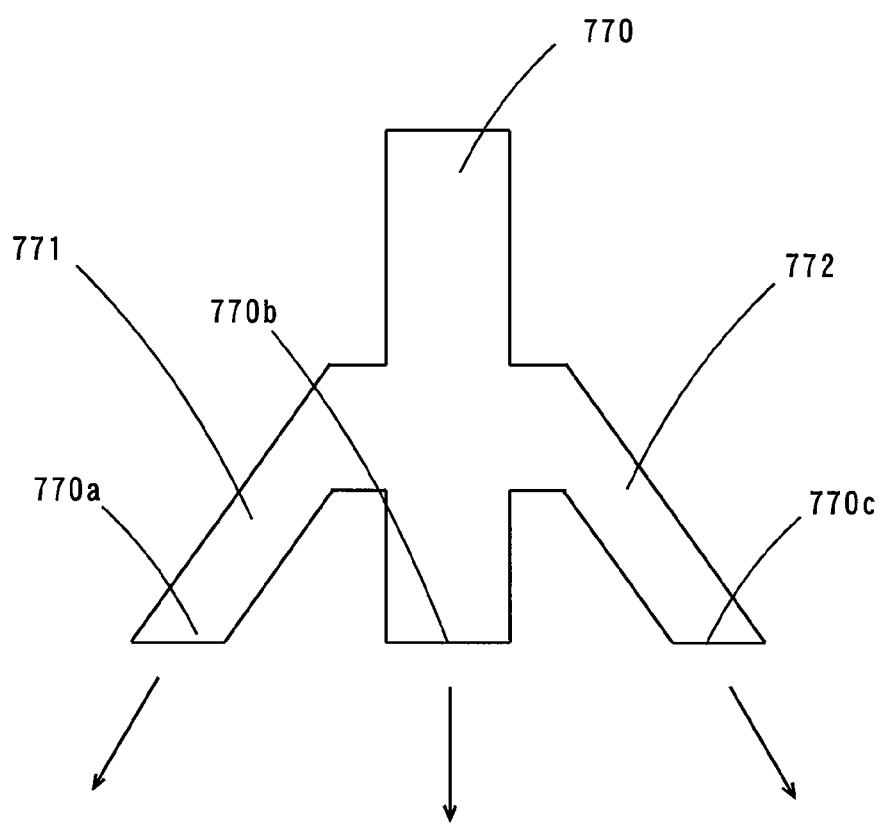
FIG. 8 is a schematic view showing another example of a nozzle for drying processing.

The nozzle 670 shown in FIG. 5 may be replaced with a nozzle 770 for drying processing as shown in FIG. 8.

The nozzle 770 shown in FIG. 8 extends vertically downward and has branch pipes 771 and 772 that extend obliquely downward from the sides thereof. Gas discharge ports 770a, 770b, and 770c for discharging an inert gas are respectively formed at a lower end of the branch pipe 771, a lower end of the nozzle 770, and a lower end of the branch pipe 772.

The discharge port 770b discharges the inert gas vertically downward, and the discharge ports 770a and 770c each discharge the inert gas obliquely downward, as indicated by arrows in FIG. 8. That is to say, the inert gas is discharged from the nozzle 770 such that a spraying range is enlarged downward.

Here, the first and second cleaning/drying processing units SD1 and SD2 subject the substrate W to drying processing by the operation described below when the nozzle 770 is used.

Figure 9:
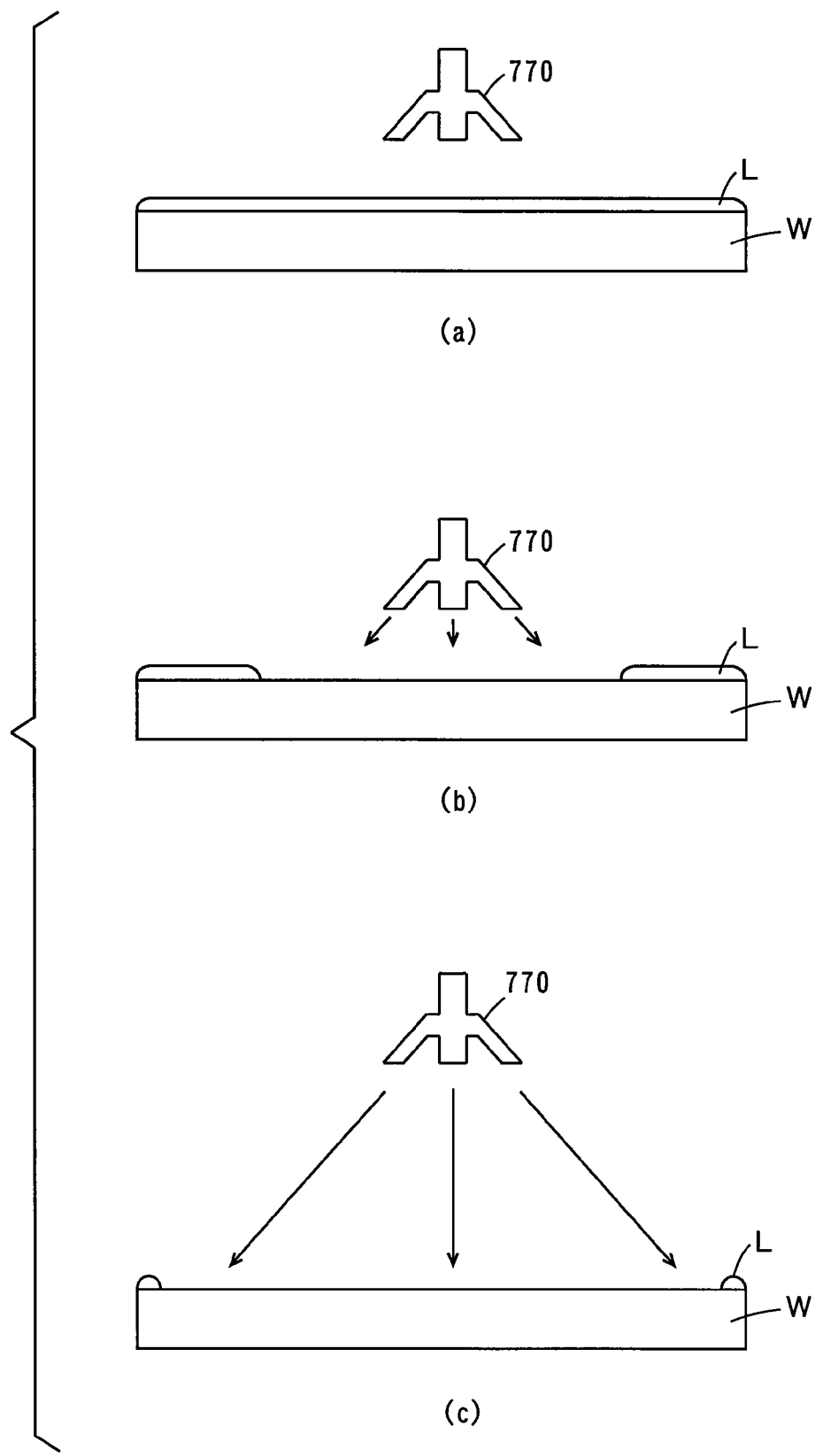
FIG. 9 is a diagram for explaining a method of subjecting a substrate to drying processing using the nozzle for drying processing shown in FIG. 8.

FIG. 9 is a diagram for explaining a method of subjecting the substrate W to drying processing using the nozzle 770.

First, a liquid layer L is formed on the main surface of the substrate W by the method described in FIG. 6 (a), and the nozzle 770 then moves to above the center of the substrate W, as shown in FIG. 9 (a).

Thereafter, the inert gas is discharged from the nozzle 770. This causes the rinse liquid at the center of the substrate W to move to the peripheral portion of the substrate W, leaving the liquid layer L only on the peripheral portion of the substrate W, as shown in FIG. 9 (b). At the time, the nozzle 770 is brought close to the surface of the main substrate W such that the rinse liquid existing at the center of the substrate W can be reliably moved.

Then, as the number of revolutions of the rotation shaft 625 (see FIG. 5) increases, the nozzle 770 moves upward, as shown in FIG. 9 (c). This causes a great centrifugal force to act on the liquid layer L on the substrate W while enlarging a range in which the inert gas is sprayed on the substrate W. As a result, the liquid layer L on the substrate W can be reliably removed. Note that the nozzle 770 can be moved up and down by raising and lowering the second rotation shaft 672 using a rotation shaft lifting mechanism (not shown) provided in the second rotation shaft 672 shown in FIG. 5.

Alternatively, the nozzle 770 may be replaced with a nozzle 870 for drying processing as shown in FIG. 10. The nozzle 870 shown in FIG. 10 has a discharge port 870a whose diameter gradually increases downward.

The discharge port 870a discharges an inert gas vertically downward and obliquely downward as indicated by arrows in FIG. 10. That is, similarly to the nozzle 770 shown in FIG. 9, the nozzle 870 discharges the inert gas such that a spraying range is enlarged downward. Consequently, the substrate W can be subjected to drying processing using the nozzle 870 by a method similar to that using the nozzle 770.

Figure 11:
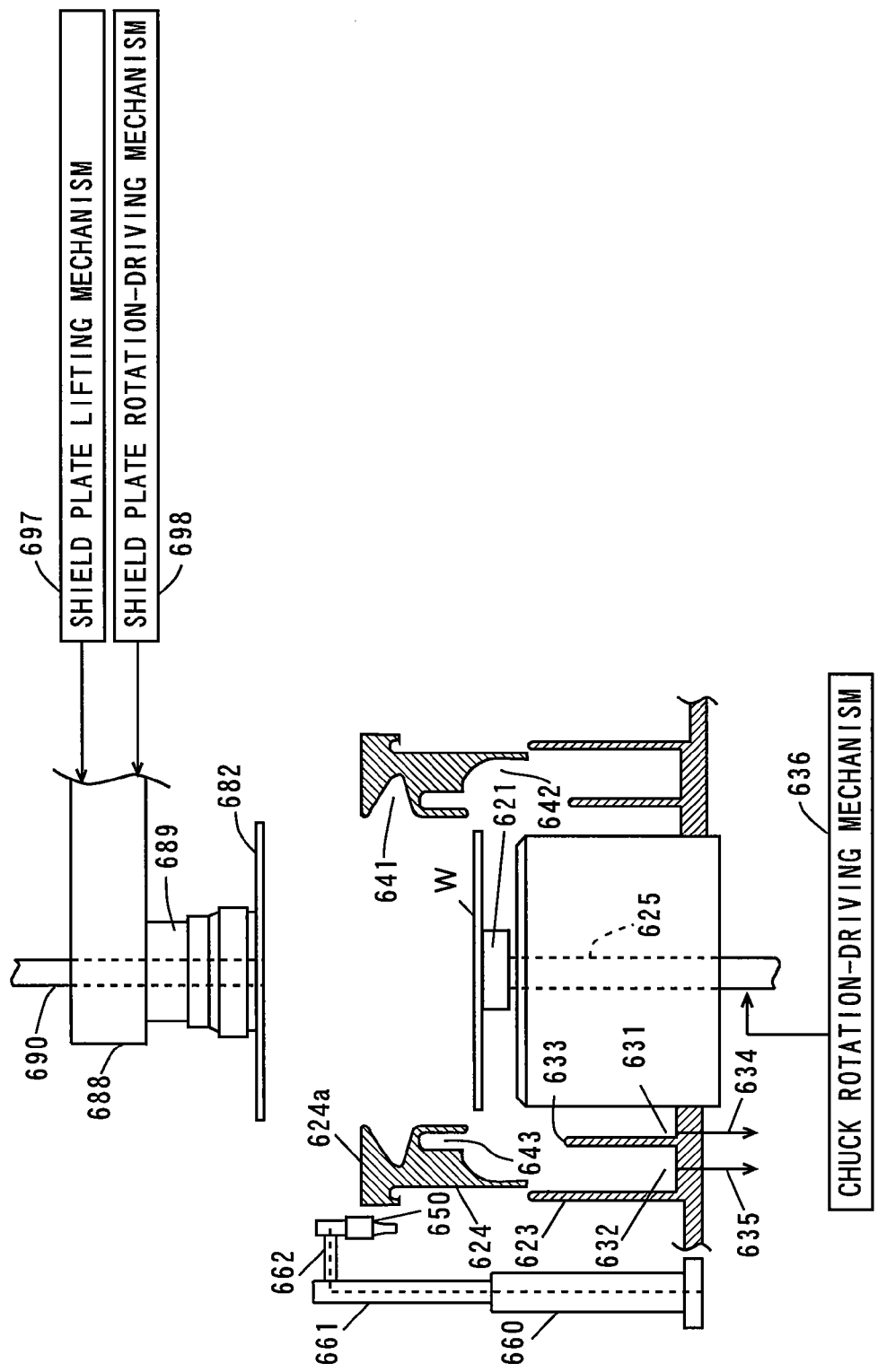
FIG. 11 is a schematic view showing another example of a cleaning/drying processing unit.

The cleaning/drying processing unit shown in FIG. 5 may be replaced with a cleaning/drying processing unit as shown in FIG. 11.

The cleaning/drying processing unit shown in FIG. 11 differs from the cleaning/drying processing unit shown in FIG. 5 in the following.

In the cleaning/drying processing unit shown in FIG. 11, a disk-shaped shield plate 682 having an opening at the center thereof is provided above a spin chuck 621. A support shaft 689 extends vertically downward from the vicinity of an end of an arm 688, and the shield plate 682 is mounted at a lower end of the support shaft 689 so as to be opposed to an upper surface of a substrate W held on the spin chuck 621.

A gas supply passage 690 that communicates with the opening of the shield plate 682 is inserted into the support shaft 689. A nitrogen gas, for example, is supplied to the gas supply passage 690.

A shield plate lifting mechanism 697 and a shield plate rotation-driving mechanism 698 are connected to the arm 688. The shield plate lifting mechanism 697 moves the shield plate 682 upward and downward between a position close to the upper surface of the substrate W held on the spin chuck 621 and a position spaced upwardly apart from the spin chuck 621.

Figure 12:
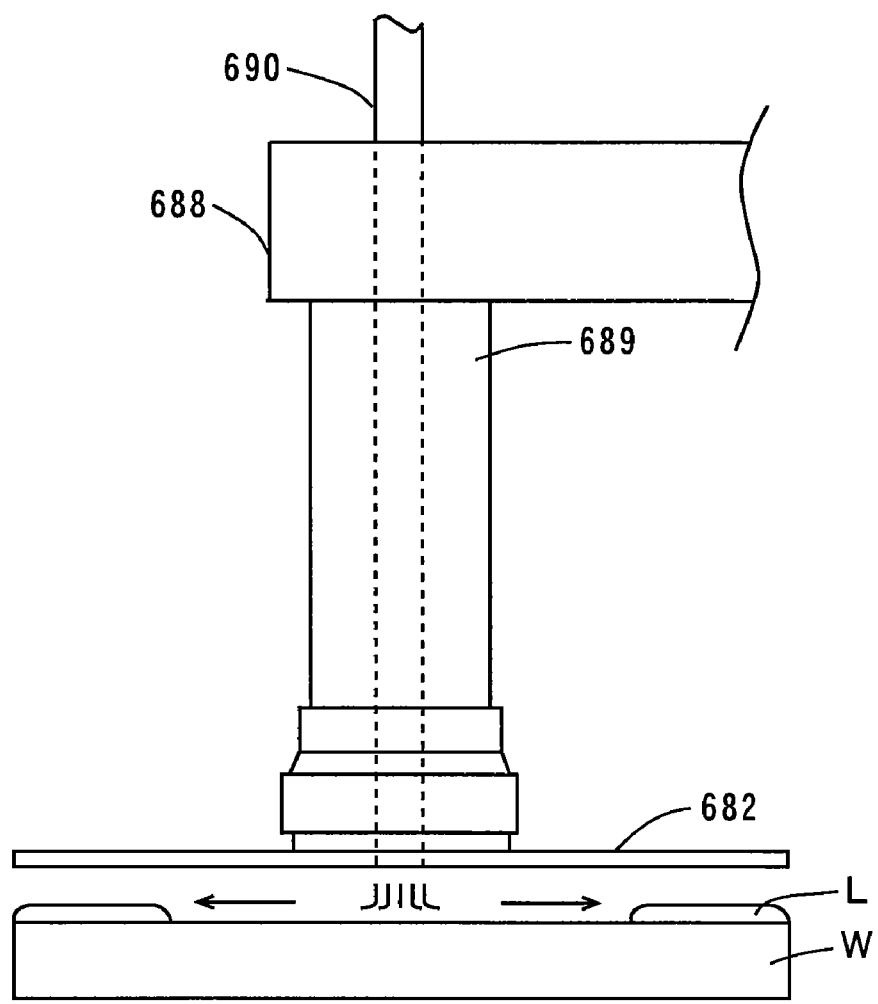
FIG. 12 is a diagram for explaining a method of subjecting a substrate to drying processing using the cleaning/drying processing unit shown in FIG. 11.

When the substrate W is subjected to the drying processing in the cleaning/drying processing unit shown in FIG. 11, an inert gas is supplied to a clearance between the substrate W and the shield plate 682 from the gas supply passage 690 with the shield plate 682 brought close to the substrate W as shown in FIG. 12. In this case, the inert gas can be efficiently supplied from the center of the substrate W to the peripheral portion thereof, thereby allowing a liquid layer L on the substrate W to be reliably removed.

Figure 13:
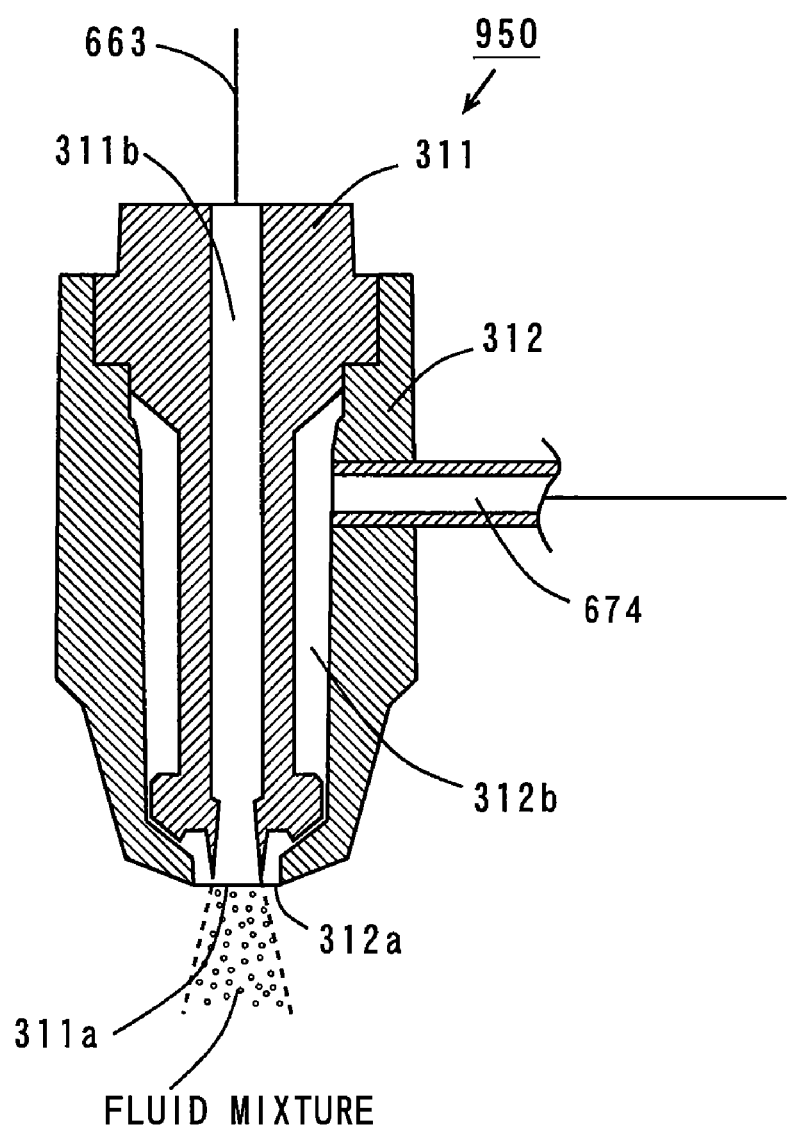
FIG. 13 is a vertical sectional view showing an example of the internal configuration of a two-fluid nozzle used for cleaning and drying processing.

(6) Examples of Cleaning/Drying Processing Unit Using Two-Fluid Nozzle (6-1) Configuration and Operation in a Case Where Two-Fluid Nozzle is Used Although description was made of a case where the nozzle 650 for cleaning processing and the nozzle 670 for drying processing as shown in FIG. 5 are used in the first and second cleaning/drying processing units SD1 and SD2 in the above-mentioned embodiment, one or both of the nozzle 650 and the nozzle 670 may be replaced with a two-fluid nozzle as shown in FIG. 13.

FIG. 13 is a vertical sectional view showing an example of the internal configuration of a two-fluid nozzle 950 used for cleaning and drying processing. From the two-fluid nozzle 950, a gas, a liquid, and a fluid mixture of a gas and a liquid can be selectively discharged.

The two-fluid nozzle 950 in the present embodiment is referred to as an external-mix type two-fluid nozzle. The external-mix type two-fluid nozzle 950 shown in FIG. 13 comprises an internal main body 311 and an external main body 312. The internal main body 311 is composed of quartz, for example, and the external main body 312 is composed of fluororesin such as PTFE (polytetrafluoroethylene), for example.

A cylindrical liquid passage 311b is formed along a central axis of the internal main body 311. A supply pipe 663 for cleaning processing shown in FIG. 5 is attached to the liquid passage 311b. This causes a cleaning liquid or a rinse liquid that is supplied from the supply pipe 663 to be introduced into the liquid passage 311b.

A liquid discharge port 311a communicating with the liquid passage 311b is formed at a lower end of the internal main body 311. The internal main body 311 is inserted into the external main body 312. Note that respective upper ends of the internal main body 311 and the external main body 312 are joined to each other, and their respective lower ends are not joined to each other.

A cylindrical gas passage 312b is formed between the internal main body 311 and the external main body 312. A gas discharge port 312a communicating with the gas passage 312b is formed at the lower end of the external main body 312. A supply pipe 674 for drying processing shown in FIG. 5 is attached to a peripheral wall of the external main body 312 so as to communicate with the gas passage 312b. This causes an inert gas supplied from the supply pipe 674 to be introduced into the gas passage 312b.

The gas passage 312b decreases in diameter downward in the vicinity of the gas discharge port 312a. As a result, the flow rate of the inert gas is accelerated, and is discharged from the gas discharge port 312a.

The cleaning liquid discharged from the liquid discharge port 311a and the inert gas discharged from the gas discharge port 312a are mixed outside the vicinity of a lower end of the two-fluid nozzle 950, and an atomized fluid mixture including a fine droplet of the cleaning liquid is produced.

Figure 14:
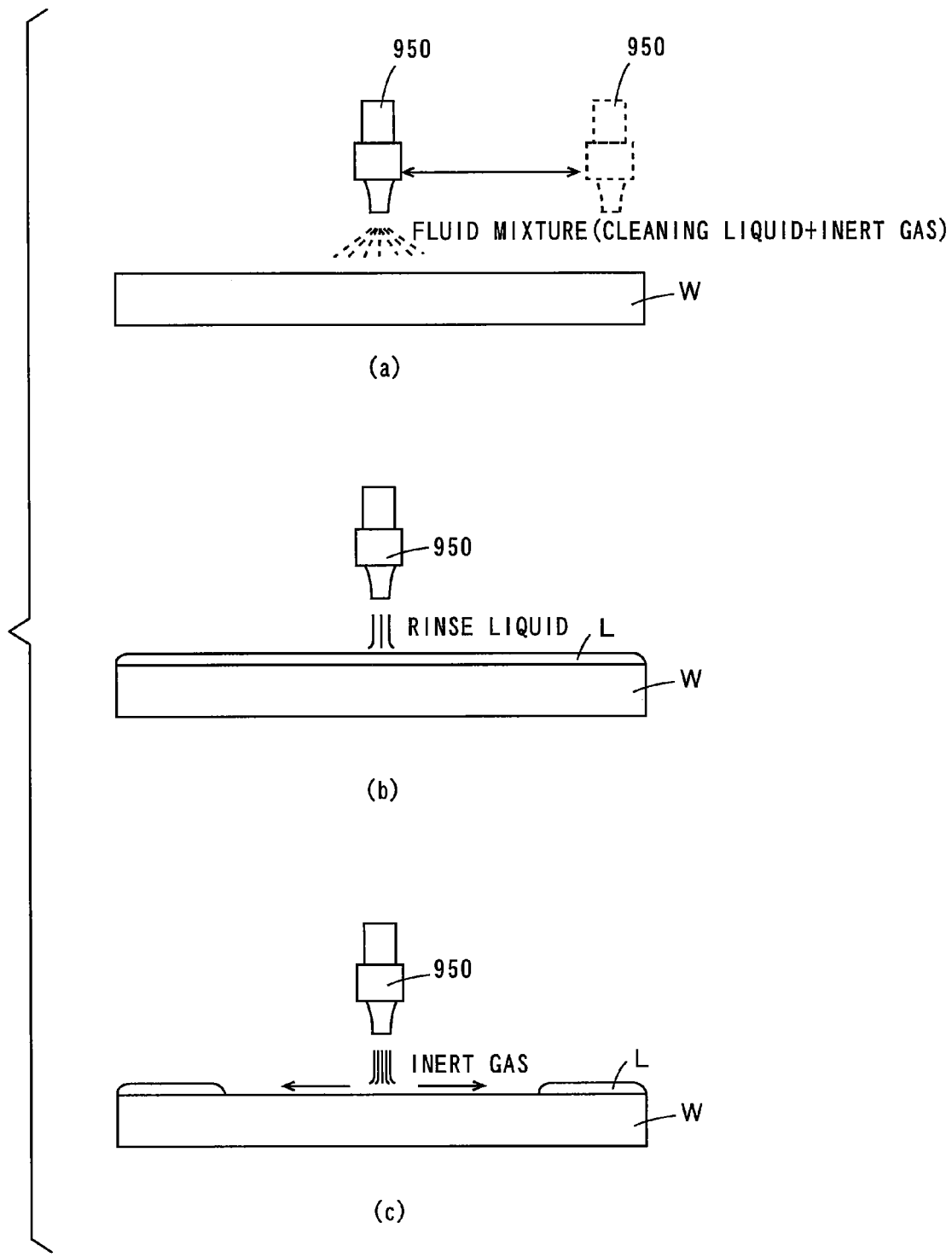
FIG. 14 is a diagram for explaining a method of subjecting a substrate to cleaning and drying processing using the two-fluid nozzle shown in FIG. 13.

FIG. 14 is a diagram for explaining a method of subjecting a substrate W to cleaning and drying processing using the two-fluid nozzle 950 shown in FIG. 13.

First, the substrate W is held by suction on the spin chuck 621 and rotates as the rotation shaft 625 rotates, as shown in FIG. 5. In this case, the rotation speed of the rotation shaft 625 is approximately 500 rpm, for example.

In this state, an atomized fluid mixture of a cleaning liquid and an inert gas is discharged onto an upper surface of the substrate W from the two-fluid nozzle 950, and the two-fluid nozzle 950 gradually moves from above the center of the substrate W to above a peripheral portion thereof, as shown in FIG. 14 (a). This causes the fluid mixture to be sprayed on the entire surface of the substrate W from the two-fluid nozzle 950, so that the substrate W is cleaned.

The supply of the fluid mixture is then stopped, so that the rotation speed of the rotation shaft 625 decreases while a rinse liquid is discharged onto the substrate W from the two-fluid nozzle 950, as shown in FIG. 14 (b). In this case, the rotation speed of the rotation shaft 625 is approximately 10 rpm, for example. Consequently, a liquid layer L of the rinse liquid is formed over the entire surface of the substrate W. Alternatively, the rotation of the rotation shaft 625 may be stopped to form the liquid layer L over the entire main surface of the substrate W. In a case where pure water is used as the cleaning liquid in the fluid mixture for cleaning the substrate W, the rinse liquid need not be supplied.

After the liquid layer L is formed, the supply of the rinse liquid is stopped. Then, an inert gas is discharged onto the substrate W from the two-fluid nozzle 950, as shown in FIG. 14 (c). This causes the cleaning liquid at the center of the substrate W to move toward the peripheral portion of the substrate W, leaving the liquid layer L only on the peripheral portion of the substrate W.

Thereafter, the rotation speed of the rotation shaft 625 increases. In this case, the rotation speed of the rotation shaft 625 is approximately 100 rpm, for example. This causes a great centrifugal force to act on the liquid layer L on the substrate W, thereby allowing the liquid layer L on the substrate W to be removed. As a result, the substrate W is dried.

When the liquid layer L on the substrate W is removed, the two-fluid nozzle 950 may gradually move from above the center of the substrate W to above the peripheral portion thereof. This allows the inert gas to be sprayed on the entire main surface of the substrate W, thereby allowing the liquid layer L on the substrate W to be reliably removed. As a result, the substrate W can be reliably dried.

(6-2) Effect of Use of Two-Fluid Nozzle

The fluid mixture discharged from the two-fluid nozzle 950 shown in FIG. 13 includes the fine droplet of the cleaning liquid. Even when the main surface of the substrate W is irregular, therefore, dirt that has adhered to the substrate W is stripped by the fine droplet of the cleaning liquid. This allows the dirt on the main surface of the substrate W to be reliably removed. Even when the wettability of a film on the substrate W is low, the dirt on the main surface of the substrate W is stripped by the fine droplet of the cleaning liquid, so that the dirt on the main surface of the substrate W can be reliably removed.

Particularly in a case where the two-fluid nozzle is used in the cleaning/drying processing unit SD, therefore, even if a solvent or the like in a resist film or a resist cover film sublimes in the heating unit HP and the sublimate adheres to the substrate W again at the time of thermal processing on the substrate W by the heating unit HP before exposure processing, the attachment can be reliably removed in the cleaning/drying processing unit SD. This can reliably prevent contamination in the exposure device 16.

By adjusting the flow rate of the inert gas, detergency in cleaning the substrate W can be easily adjusted. In a case where an organic film (resist film or resist cover film) on the substrate W has the property of being easily damaged, therefore, the organic film on the substrate W can be prevented from being damaged by weakening the detergency. In a case where the dirt on the main surface of the substrate W is tough, the dirt on the main surface of the substrate W can be reliably removed by strengthening the detergency. The detergency is thus adjusted in conformity with the property of the organic film on the substrate W and the degree of the dirt, thereby allowing the substrate W to be reliably cleaned while preventing the organic film on the substrate W from being damaged.

In the external-mix type two-fluid nozzle 950, the fluid mixture is produced by mixing the cleaning liquid and the inert gas outside the two-fluid nozzle 950. The inert gas and the cleaning liquid are separated to respectively flow in different flow paths inside the two-fluid nozzle 950. This allows the inert gas to be individually discharged from the two-fluid nozzle 950 without causing the cleaning liquid to remain within the gas passage 312b. Further, the rinse liquid is supplied from the supply pipe 663, so that the rinse liquid can be individually discharged from the two-fluid nozzle 950. Consequently, the fluid mixture, the inert gas, and the rinse liquid can be selectively discharged from the two-fluid nozzle 950.

In a case where the two-fluid nozzle 950 is used, a nozzle for supplying the cleaning liquid or the rinse liquid to the substrate W and a nozzle for supplying the inert gas to the substrate W need not be separately provided, respectively. This allows the substrate W to be reliably cleaned and dried in a simple configuration.

Although in the foregoing description, the rinse liquid is supplied to the substrate W by the two-fluid nozzle 950, the rinse liquid may be supplied to the substrate W using separate nozzles.

Although in the foregoing description, the inert gas is supplied to the substrate W by the two-fluid nozzle 950, the inert gas may be supplied to the substrate W using separate nozzles.

(7) Another Embodiment

Although in the above-mentioned embodiment, all of the three cleaning/drying processing units SD (see FIG. 4) subject the substrate W after exposure processing to cleaning and drying processing, one or two of three cleaning/drying processing units SD may subject a substrate W before exposure processing to cleaning and drying processing.

In this case, during the cleaning processing, a part of a component of a resist cover film on the substrate W is eluted in a cleaning liquid or a rinse liquid and cleaned away. Therefore, even if the substrate W is brought into contact with the liquid in an exposure device 16, the component of the resist cover film on the substrate W is hardly eluted in the liquid. Further, it is possible to remove particles and the like that have adhered to the substrate W before the exposure processing. As a result, this prevent contamination in the exposure device 16.

Furthermore, the cleaning/drying processing unit SD subjects the substrate W to drying processing after subjecting the substrate W to cleaning processing. This causes the cleaning liquid or the rinse liquid adhering to the substrate W during the cleaning processing to be removed, which prevents particles and the like in an atmosphere from adhering to the substrate W after the cleaning processing again. As a result, the contamination in the exposure device 16 can be reliably prevented.

The cleaning/drying processing unit SD subjects the substrate W to the drying processing by spraying an inert gas on the substrate W from the center to a peripheral portion thereof while rotating the substrate W. In this case, the cleaning liquid and the rinse liquid on the substrate W can be reliably removed, which can reliably prevent the particles and the like in the atmosphere from adhering to the cleaned substrate W. Further, this can reliably prevent the component of the resist cover film eluted in the cleaning liquid from remaining on the substrate W. As a result, it is possible to reliably prevent the contamination of the substrate W and the generation of dry marks on a main surface of the substrate W.

Note that a sixth central robot CR6 transports the substrate W from a sending buffer unit SBF to the cleaning/drying processing unit SD in a case where the cleaning/drying processing unit SD subjects the substrate W before exposure processing to cleaning and drying processing. Thereafter, the sixth central robot CR6 transports the substrate W that has been subjected to the cleaning and drying processing before the exposure processing in the cleaning/drying processing unit SD to a placement/cooling unit P-CP.

The component of the resist cover film may be eluded with pure water poured onto the substrate W and kept thereon for a certain time period.

In a case where the cleaning/drying processing unit SD subjects the substrate W to the cleaning processing, the resist cover film processing block 13 may not be provided. In this case, a part of a component of a resist film is eluted in the cleaning liquid during the cleaning processing in the cleaning/drying processing unit SD. Therefore, even if the resist film is brought into contact with the liquid in the exposure device 16, the component of the resist film is prevented from being eluted in the liquid. As a result, the contamination in the exposure device 16 can be prevented.

If the resist cover film processing block 13 is not provided, the resist cover film removal block 14 need not be provided. This allows the footprint of a substrate processing apparatus 500 to be reduced. In a case where the resist cover film processing block 13 and the resist cover film removal block 14 are not provided, the substrate W is subjected to post-exposure bake in a thermal processing group 121 for development in a development processing block 12, and an edge exposure unit EEW can be arranged in a development processing group 70 (see FIG. 2).

The respective numbers of cleaning/drying processing units SD, coating units BARC, RES, and COV, development processing units DEV, removal units REM, heating units HP, cooling units CP, and placement/cooling units P-CP may be appropriately changed depending on the processing speed of each of the processing blocks.

(8) Correspondence Between Each Constituent Element in the Claims and Each Part in the Embodiments In the following paragraphs, non-limiting examples of correspondences between various elements recited in the claims below and those described above with respect to various preferred embodiments of the present invention are explained.

In the embodiments described above, the anti-reflection film processing block 10, the resist film processing block 11, the development processing block 12, the resist cover film processing block 13, and the resist cover film removal block 14 are examples of a processing section, the interface block 15 is an example of an interface, the cleaning/drying processing unit SD is an example of a drying processing unit and a cleaning processing unit, the placement/cooling unit P-CP is an example of a platform and a temperature control waiting unit, the sixth central robot CR6 is an example of a first transport unit, the interface transport mechanism IFR is an example of a second transport unit, the hand H1 is an example of a first holder, and the hand H2 is an example of the second holder.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A substrate processing apparatus that is arranged adjacent to an exposure device, comprising:
   a processing section for subjecting a substrate to processing; and
   an interface that transfers and receives the substrate between said processing section and said exposure device,
   said interface including:
   a drying processing unit that subjects the substrate to drying processing after exposure processing by said exposure device,
   a platform on which the substrate is temporarily placed,
   a first transport unit that transports the substrate among said processing section, said platform, and said drying processing unit, and
   a second transport unit that transports the substrate among said platform, said exposure device, and said drying processing unit,
   said second transport unit carrying the substrate after the exposure processing by said exposure device into said drying processing unit,
   said first transport unit carrying the substrate after the drying processing by said drying processing unit out of said drying processing unit,
   wherein said interface further includes a cleaning processing unit that subjects the substrate to cleaning processing before the exposure processing by the exposure device, and
   said first transport unit transports the substrate among said processing section, said cleaning processing unit, said platform, and said drying processing unit.

2. The substrate processing apparatus according to claim 1, wherein said drying processing unit subjects the substrate to cleaning processing before subjecting the substrate to the drying processing.

3. The substrate processing apparatus according to claim 1, wherein said cleaning processing unit subjects the substrate to the drying processing after subjecting the substrate to the cleaning processing.

4. The substrate processing apparatus according to claim 1, wherein
   said second transport unit includes first and second holders that each hold the substrate,
   said first holder holds, when the substrate before the exposure processing by said exposure device is transported, the substrate, and
   said second holder holds, when the substrate after said exposure processing is transported, the substrate.

5. The substrate processing apparatus according to claim 4, wherein said second holder is provided below said first holder.

6. A substrate processing apparatus that is arranged adjacent to an exposure device, comprising:
   a processing section for subjecting a substrate to processing; and
   an interface that transfers and receives the substrate between said processing section and said exposure device,
   said interface including
   a drying processing unit that subjects the substrate to drying processing after exposure processing by said exposure device,
   a platform on which the substrate is temporarily placed, wherein said platform is a temperature control waiting unit that makes the substrate before the exposure processing by said exposure device wait until the substrate can be carried into said exposure device while keeping the substrate at a predetermined temperature,
   a first transport unit that transports the substrate among said processing section, said platform, and said drying processing unit, and
   a second transport unit that transports the substrate among said platform, said exposure device, and said drying processing unit,
   said second transport unit carrying the substrate after the exposure processing by said exposure device into said drying processing unit,
   said first transport unit carrying the substrate after the drying processing by said drying processing unit out of said drying processing unit.

* * * * *